(12) United States Patent
Kurokawa

(10) Patent No.: US 9,379,706 B2
(45) Date of Patent: Jun. 28, 2016

(54) PROGRAMMABLE LOGIC DEVICE

(71) Applicant: SEMICONDUCTOR ENERGY LABORATORY CO., LTD., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 14/632,023

(22) Filed: Feb. 26, 2015

(65) Prior Publication Data
US 2015/0171865 A1 Jun. 18, 2015

Related U.S. Application Data

(63) Continuation of application No. 13/873,331, filed on Apr. 30, 2013, now Pat. No. 8,970,251.

(30) Foreign Application Priority Data

May 2, 2012 (JP) ................................. 2012-105031

(51) Int. Cl.
*H03K 19/177* (2006.01)
*H01L 25/00* (2006.01)
*H03K 19/00* (2006.01)
(Continued)

(52) U.S. Cl.
CPC ........ *H03K 19/0013* (2013.01); *H01L 27/0688* (2013.01); *H01L 27/1156* (2013.01); *H01L 27/11803* (2013.01); *H03K 19/094* (2013.01);
(Continued)

(58) Field of Classification Search
None
See application file for complete search history.

(56) References Cited

U.S. PATENT DOCUMENTS 4,609,986 A   9/1986   Hartmann et al.
4,642,487 A * 2/1987   Carter .............................. 326/41
(Continued)

FOREIGN PATENT DOCUMENTS

CN        001667751 A    9/2005
CN        001967719 A    5/2007
(Continued)

OTHER PUBLICATIONS

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.
(Continued)

*Primary Examiner* — Anh Tran
(74) *Attorney, Agent, or Firm* — Fish & Richardson P.C.

(57) ABSTRACT

Disclosed is a programmable logic device (PLD) which can undergo dynamic configuration at a high speed. The PLD includes a plurality of programmable logic elements (PLEs) and a switch for selecting electrical connection between the PLEs. The switch includes a plurality of circuit groups each of which includes first and second transistors. The second transistors of the circuit groups are electrically connected in parallel with one another. In each of the circuit groups, the electrical conduction between a source and a drain of the second transistor is determined based on configuration data held at a node between the gate of the second transistor and a drain of the first transistor, which allows the selection of the electrical connection and disconnection between the programmable logic elements by the selection of one of the circuit groups.

14 Claims, 17 Drawing Sheets

(51) Int. Cl.

| | | |
|---|---|---|
| H03K 19/094 | (2006.01) | |
| H01L 27/06 | (2006.01) | |
| H01L 27/115 | (2006.01) | |
| H01L 27/118 | (2006.01) | |
| H01L 27/12 | (2006.01) | |

(52) U.S. Cl.
CPC ...... *H03K 19/17744* (2013.01); *H01L 27/1225* (2013.01)

(56) References Cited

U.S. PATENT DOCUMENTS

| | | | |
|---|---|---|---|
| 4,870,302 | A | 9/1989 | Freeman |
| RE34,363 | E * | 8/1993 | Freeman ............ 326/38 |
| 5,731,856 | A | 3/1998 | Kim et al. |
| 5,744,864 | A | 4/1998 | Cillessen et al. |
| 6,127,702 | A | 10/2000 | Yamazaki et al. |
| 6,172,521 | B1 | 1/2001 | Motomura |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,088,606 | B2 | 8/2006 | Turner |
| 7,105,868 | B2 | 9/2006 | Nause et al. |
| 7,211,825 | B2 | 5/2007 | Shih et al |
| 7,277,316 | B2 | 10/2007 | Turner |
| 7,277,351 | B2 | 10/2007 | Liu et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,602,634 | B2 | 10/2009 | Turner |
| 7,629,812 | B2 | 12/2009 | Thummalapally et al. |
| 7,674,650 | B2 | 3/2010 | Akimoto et al. |
| 7,732,819 | B2 | 6/2010 | Akimoto et al. |
| 8,547,753 | B2 | 10/2013 | Takemura et al. |
| 8,760,931 | B2 | 6/2014 | Takemura et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0242385 | A1 | 10/2006 | Murakami et al. |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0122007 | A1 | 5/2010 | Lahti et al. |
| 2010/0148171 | A1 | 6/2010 | Hayashi et al. |
| 2010/0207660 | A1 | 8/2010 | Madurawe |
| 2011/0101351 | A1 | 5/2011 | Yamazaki |
| 2011/0175646 | A1 | 7/2011 | Takemura et al. |
| 2012/0212995 | A1 | 8/2012 | Kurokawa |
| 2012/0293200 | A1 | 11/2012 | Takemura |
| 2012/0293201 | A1 | 11/2012 | Fujita et al. |
| 2012/0293202 | A1 | 11/2012 | Nishijima et al. |
| 2012/0293206 | A1 | 11/2012 | Yoneda et al. |
| 2012/0293209 | A1 | 11/2012 | Takewaki |
| 2012/0293242 | A1 | 11/2012 | Kato |
| 2013/0207170 | A1 | 8/2013 | Kurokawa |
| 2013/0285697 | A1 | 10/2013 | Kurokawa |
| 2013/0321025 | A1 | 12/2013 | Kurokawa et al. |
| 2014/0252346 | A1 | 9/2014 | Takemura et al. |

FOREIGN PATENT DOCUMENTS

| | | |
|---|---|---|
| CN | 101111834 A | 1/2008 |
| CN | 102209959 A | 10/2011 |
| CN | 102714496 A | 10/2012 |
| EP | 1580761 A | 9/2005 |
| EP | 1737044 A | 12/2006 |
| EP | 1788706 A | 5/2007 |
| EP | 2226847 A | 9/2010 |
| EP | 2464011 A | 6/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |

(56) References Cited

FOREIGN PATENT DOCUMENTS

| | | |
|---|---|---|
| JP | 05-251705 A | 9/1993 |
| JP | 08-264794 A | 10/1996 |
| JP | 10-285014 A | 10/1998 |
| JP | 11-505377 | 5/1999 |
| JP | 2000-044236 A | 2/2000 |
| JP | 2000-150900 A | 5/2000 |
| JP | 3106998 | 11/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-186797 A | 9/2012 |
| KR | 2012-0094834 A | 8/2012 |
| WO | WO-2004/114391 | 12/2004 |
| WO | WO-2006/059775 | 6/2006 |
| WO | WO-2010/056719 | 5/2010 |
| WO | WO-2011/089808 | 7/2011 |

OTHER PUBLICATIONS

Asaoka.Y et al., "29.1:Polarizer-Free Reflective LCD Combined with Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and SN-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008. vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev.Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", JPN. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)_m$ (m<4):a Zn4s conductor", Philosophical Magazine, 2001, vol. 81, No. 5, pp. 501-515.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Chun.K et al., "A 3T Gain Cell Embedded DRAM Utilizing Preferential Boosting for High Density and Low Power On-Die Caches", IEEE Journal of Solid-State Circuits, Jun. 1, 2011, vol. 46, No. 6, pp. 1495-1505.

Eslami.F et al., "Capacitive Boosting for FPGA Interconnection Networks", 21st International Conference on Field Programmable Logic and Applications, 2011, vol. 21, pp. 453-458.

International Search Report (Application No. PCT/JP2013/061696) Dated Jun. 11, 2013.

Written Opinion (Application No. PCT/JP2013/061696) Dated Jun. 11, 2013.

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

Naito.T et al., "World's first monolithic 3D-FPGA with TFT SRAM over 90nm 9 layer Cu CMOS", 2010 Symposium on VLSI Technology : Digest of Technical Papers, Jun. 15, 2010, pp. 219-220.

(56) References Cited

OTHER PUBLICATIONS

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Yanagawa.Y et al., "In-substrate-bitline Sense Amplifier with Array-noise-gating Scheme for Low-noise 4F2 DRAM Array Operable at 10-fF Cell Capacitance", 2011 Symposium on VLSI Circuits Digest of Technical Papers, Jun. 15, 2011, pp. 230-231, IEEE.

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Chinese Office Action (Application No. 201380022919.4) Dated Oct. 22, 2015.

* cited by examiner

FIG. 16

| | 720a | 720b |
|---|---|---|
| Circuit diagram | 722⏋<br>721⎿ 701(OS) FD<br>IN 702(Si) OUT | 722⏋ 780<br>721⎿ 701(Si) FD ▷○▷<br>IN 702(Si) OUT 781 |
| Configuration data "1" | IN<br>FD | IN<br>FD |
| Configuration data "0" | IN<br>FD | IN<br>FD |

PROGRAMMABLE LOGIC DEVICE

CROSS-REFERENCE TO RELATED APPLICATIONS

This application is a continuation of U.S. application Ser. No. 13/873,331, filed Apr. 30, 2013, now allowed, which claims the benefit of a foreign priority application filed in Japan as Serial No. 2012-105031 on May 2, 2012, both of which are incorporated by reference.

TECHNICAL FIELD

The present invention relates to a semiconductor device and particularly to a programmable logic device and a semiconductor device including the programmable logic device. The present invention also relates to an electronic device including the semiconductor device.

BACKGROUND ART

Unlike a normal integrated circuit in which all circuits are fixed at the time of manufacture, a programmable logic device (PLD) is a device that can function with an intended circuit structure set by a user at the time of actual use after shipment. Examples of such devices that are programmable by users are a small-scale programmable array logic (PAL) and generic array logic (GAL) and a large-scale complex programmable logic device (CPLD) and field programmable gate array (FPGA); in this specification, such devices are collectively called a programmable logic device (hereinafter referred to as PLD).

PLDs have advantages such as a short development period and flexibility in changing design specifications over conventional application specific integrated circuits (ASIC). Thus, the use of PLDs for semiconductor devices has been promoted in recent years.

A PLD is composed of, for example, a plurality of programmable logic elements (also referred to as logic blocks) and wirings between the programmable logic elements. A function of the PLD can be changed by changing a function of the programmable logic elements. Moreover, a function of the PLD can be changed by changing an electrical connection relation between programmable logic elements.

The programmable logic element is composed of a lookup table (LUT) and a multiplexer, for example. A function of the programmable logic element can be specified by setting a given value in a memory element that stores data of the lookup table. Further, a function of the programmable logic element can be specified by setting a given value in a memory element that stores information on selection of signals input to the multiplexer.

The wirings between the programmable logic elements are constituted using, for example, a connection switch capable of controlling connections between plural wirings and plural wirings. The electrical connection relation of the wirings between the programmable logic elements can be specified by setting a given value in a memory element that stores data on the on/off state of the connection switch.

The aforementioned information including the data of a lookup table, the information on selection of signals input to a multiplexer, and the data on the on/off state of a connection switch is referred to as configuration data, for example. A memory element storing configuration data is referred to as a configuration memory. Setting configuration data in a configuration memory is called "configuration". In particular, setting new configuration data (updating configuration data) in a configuration memory is called "reconfiguration". The circuit structure of the PLD can be changed into a circuit structure suitable for a user's request by producing (programming) desired configuration data and performing the configuration.

The PLD generally performs configuration (static configuration) while the operation of a semiconductor device including the PLD is stopped. In contrast, to further exploit the features of the PLD, a technique of performing configuration (dynamic configuration) while the semiconductor device operates has attracted attention. Specifically, plural pieces of configuration data corresponding to a plurality of circuit structures (contexts) are prepared, and circuit functions are switched. Such a PLD can be called a multi-context PLD.

For dynamic configuration in Patent Document 1, each piece of configuration data corresponding to a plurality of circuit structures is stored at a different address in a dynamic random access memory (DRAM), and a configuration memory is composed of a static random access memory (SRAM). Patent Document 1 suggests a method of performing configuration in a short time by reading configuration data on a desired circuit structure from the address of the DRAM and writing the configuration data into the SRAM, which is the configuration memory.

REFERENCE

Patent Document 1: Japanese Published Patent Application No. H10-285014

DISCLOSURE OF INVENTION

However, with the structure disclosed in Patent Document 1, regular refresh operation is required to maintain configuration data in the DRAM, and the power consumption is increased as a result. Since the DRAM is a volatile memory, it is necessary to store data in the DRAM every time the PLD is powered on. For this reason, a nonvolatile memory is needed to store configuration data. In addition, a step of transferring a large volume of data from the nonvolatile memory to the DRAM is required every time the PLD is powered on; thus, the startup time is increased.

In the case where an SRAM is used as the configuration memory, at least four transistors are required, which leads to a significant increase in the number of elements in the entire PLD and an increase in the circuit area.

In view of the above, an object of one embodiment of the present invention is to provide a low power consumption PLD that achieves high-speed configuration capable of dynamic configuration and has a short startup time.

Another object is to provide a PLD with a smaller circuit area than a PLD using an SRAM as a configuration memory.

In light of the above objects, one embodiment of the present invention provides a high-performance PLD that can be reconfigured during the operation with a smaller number of transistors per bit and a shorter time necessary to switch configuration data, as a PLD including a nonvolatile memory capable of storing plural pieces of configuration data.

The nonvolatile memory holds and stores configuration data by controlling the amount of charge at a storage node with a transistor having extremely low off-state current. With this structure, charge can be held, and a nonvolatile memory can be easily achieved.

Specifically, the transistor included in the nonvolatile memory includes, in its channel formation region, a semiconductor material having a wider band gap and lower intrinsic carrier density than silicon. With a channel formation region including a semiconductor material having such characteristics, a transistor with extremely low off-state current can be achieved. Examples of such a semiconductor material are an oxide semiconductor, silicon carbide, and gallium nitride, which have a band gap about three times as wide as that of silicon. A transistor including the above semiconductor material can have much lower off-state current than a transistor including a normal semiconductor material such as silicon or germanium.

One embodiment of the present invention is a programmable logic device that includes a plurality of programmable logic elements arranged in an array, and a switch configured to select electrical connection between the programmable logic elements. The switch includes a plurality of groups each of which includes a first transistor including an oxide semiconductor layer in which a channel is formed, a node that becomes floating when the first transistor is turned off, and a second transistor in which electrical conduction between a source and a drain is determined based on configuration data held at the node. The second transistors included in the groups are electrically connected in parallel with each other. Selecting one of the groups sets the on/off state of the switch and sets electrical conduction between the programmable logic elements.

In one embodiment of the present invention, specifically, each of the plurality of groups is configured as follows, for example. A gate of the first transistor is electrically connected to a first wiring. One of a source and a drain of the first transistor is electrically connected to a second wiring. The other of the source and the drain of the first transistor is electrically connected to a gate of the second transistor and one of a pair of electrodes of a capacitor. One of the source and the drain of the second transistor is electrically connected to an input terminal of the switch. The other of the source and the drain of the second transistor is electrically connected to an output terminal of the switch. The other of the pair of electrodes of the capacitor is electrically connected to a third wiring.

In one embodiment of the present invention, the programmable logic element may include a circuit configured to input an enable signal to an output terminal of the programmable logic element.

According to one embodiment of the present invention, it is possible to provide a low power consumption PLD that achieves high-speed configuration capable of dynamic configuration and has short startup time.

Moreover, it is possible to provide a PLD that has a smaller number of transistors or a smaller circuit area than a PLD using an SRAM as a configuration memory.

BRIEF DESCRIPTION OF DRAWINGS

In the accompanying drawings:

FIG. 16 illustrates circuit diagrams of cells and timing charts; and

BEST MODE FOR CARRYING OUT THE INVENTION

Hereinafter, embodiments of the invention disclosed in this specification will be described in detail with reference to the accompanying drawings. Note that the invention disclosed in this specification is not limited to the following description, and it is easily understood by those skilled in the art that modes and details can be variously changed without departing from the spirit and scope of the invention. The invention disclosed in this specification is not construed as being limited to the description of the following embodiments.

Note that ordinal numbers such as first and second are used for convenience and do not indicate a unique name as an item for specifying the invention in this specification.

The terms "electrically connected" and "electrical connection" include the case where components are connected through an object having any electric function. There is no particular limitation on an object having any electric function as long as electric signals can be transmitted and received between the components connected through the object. Examples of an object having any electric function are a switching element such as a transistor, a resistor, an inductor, a capacitor, and an element with a variety of functions as well as an electrode and a wiring.

Note that a semiconductor device of the present invention includes, in its category, a variety of semiconductor integrated circuits formed using semiconductor elements, such as microprocessors, image processing circuits, controllers for semiconductor display devices, digital signal processors (DSPs), and microcontrollers. The semiconductor device of the present invention also includes, in its category, various devices such as RF tags formed using any of the above semiconductor integrated circuits and semiconductor display devices. The semiconductor display device includes, in its category, liquid crystal display devices, light-emitting devices in which a light-emitting element typified by an organic light-emitting diode (OLED) is provided for each pixel, electronic paper, digital micromirror devices (DMDs), plasma display panels (PDPs), field emission displays (FEDs), and other semiconductor display devices in which a semiconductor element is included in a driver circuit.

(Embodiment 1)

In Embodiment 1, one embodiment of a PLD will be described with reference to FIGS. 1A and 1B, FIG. 2, FIG. 3, and FIG. 4.

Figure 1A:
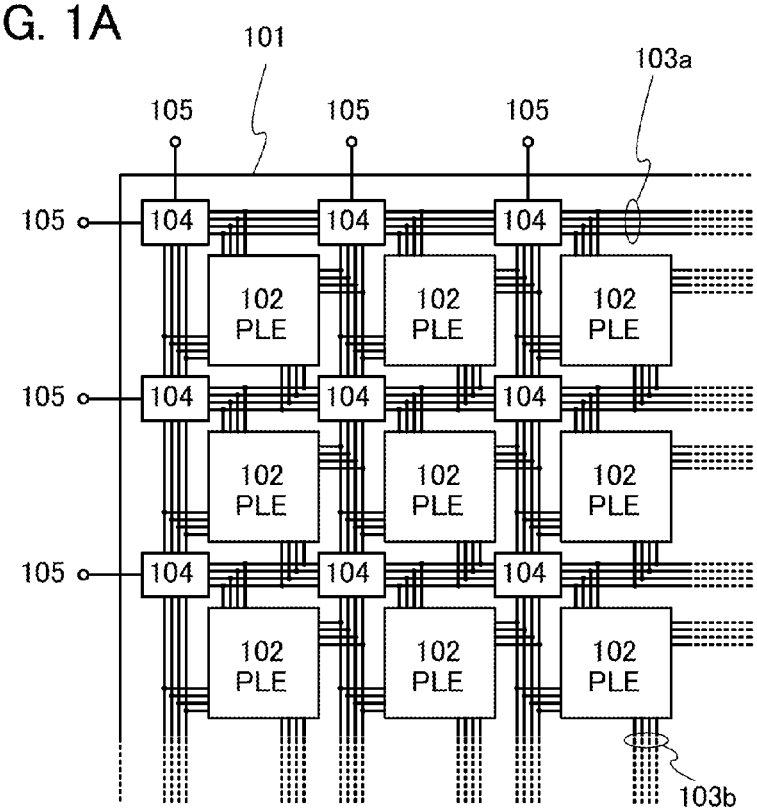
FIGS. 1A and 1B are circuit diagrams illustrating one embodiment of a semiconductor device.

FIG. 1A conceptually illustrates part of a logic array in the PLD. A logic array 101 includes a plurality of programmable logic elements 102 arranged in an array (the programmable logic element is denoted by PLE in FIG. 1A). Here, the term "arranged in an array" means that the programmable logic elements are arranged at regular intervals, and the arrangement is not limited to that illustrated in FIG. 1A.

A plurality of wirings are formed to surround the programmable logic elements 102. In FIG. 1A, these wirings consist of a plurality of horizontal wiring groups 103a and a plurality of vertical wiring groups 103b. A wiring group is a bundle of wirings, and for example is a bundle of four wirings as illustrated in FIG. 1A. A switch box 104 is provided at an intersection of the horizontal wiring group 103a and the vertical wiring group 103b. The horizontal wiring groups 103a and the vertical wiring groups 103b are electrically connected to output terminals 105 to transmit and receive signals to and from a circuit provided outside the logic array 101.

Input terminals and output terminals of the plurality of programmable logic elements 102 are electrically connected to the horizontal wiring groups 103a and the vertical wiring groups 103b provided around the programmable logic elements 102. For example, the programmable logic elements 102 illustrated in FIG. 1A each have four terminals on each of the left, right, top, and bottom sides, and the upper and left terminals can serve as input terminals and the right and lower terminals can serve as output terminals. With the use of these input and output terminals, each of the programmable logic elements 102 can be electrically connected to another programmable logic element 102.

Figure 1B:
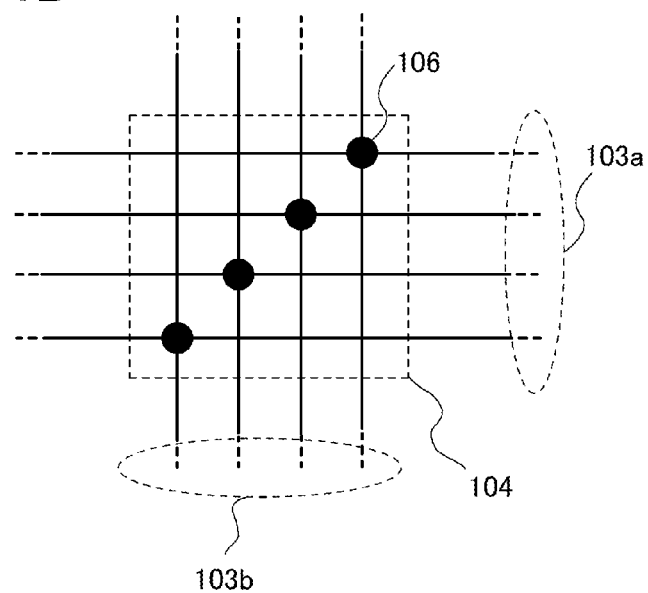

An electrical connection relation between a given programmable logic element 102 and another programmable logic element 102 is determined by a programmable switch provided in the switch box 104. FIG. 1B is an enlarged view of the switch box 104. For example, when the horizontal wiring group 103a and the vertical wiring group 103b each consist of four wirings, there are 16 intersections of the horizontal wiring group 103a and the vertical wiring group 103b. If a switch group 106 is provided at all the intersections, there are significant disadvantages such as signal delay, increase in chip area, and increase in cost. In view of these disadvantages, for example, as illustrated in FIG. 1B, the switch group 106 is provided only at intersections placed diagonally among the 16 intersections. In other words, in one switch box 104, one horizontal wiring has only one switch group 106 which is shared with only one vertical wiring.

Figure 2:
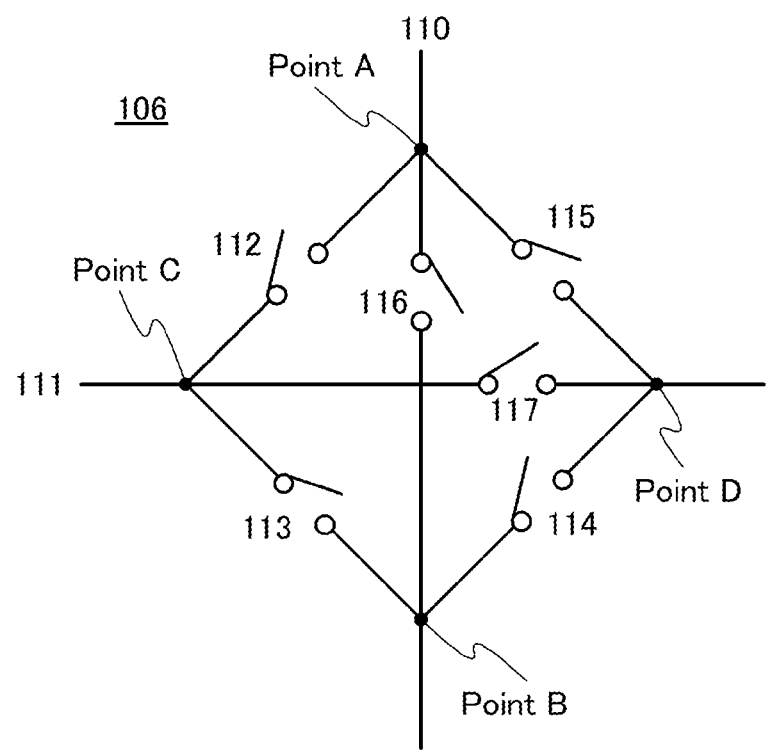
FIG. 2 is a circuit diagram illustrating one embodiment of a semiconductor device.

The switch group 106 is composed of a plurality of switches. FIG. 2 illustrates a structure of the switch group 106. The switch group 106 is provided at an intersection of one wiring 111 included in the horizontal wiring group 103a and one wiring 110 included in the vertical wiring group 103b in FIG. 1B. The switch group 106 has a function of controlling connection of the wiring 111 and the wiring 110. Specifically, the switch group 106 includes switches 112 to 117. The switch 112 has a function of controlling electrical connection between a point A of the wiring 110 and a point C of the wiring 111. The switch 113 has a function of controlling electrical connection between a point B of the wiring 110 and the point C of the wiring 111. The switch 115 has a function of controlling electrical connection between the point A of the wiring 110 and a point D of the wiring 111. The switch 114 has a function of controlling electrical connection between the point B of the wiring 110 and the point D of the wiring 111. The switch 116 has a function of controlling electrical connection between the point A and the point B of the wiring 110. The switch 117 has a function of controlling electrical connection between the point C and the point D of the wiring 111.

The switches 112 to 117 each store configuration data, and the on/off state of each of the switches 112 to 117 is selected in accordance with the configuration data.

(Structure of Switch 200)

Figure 3:
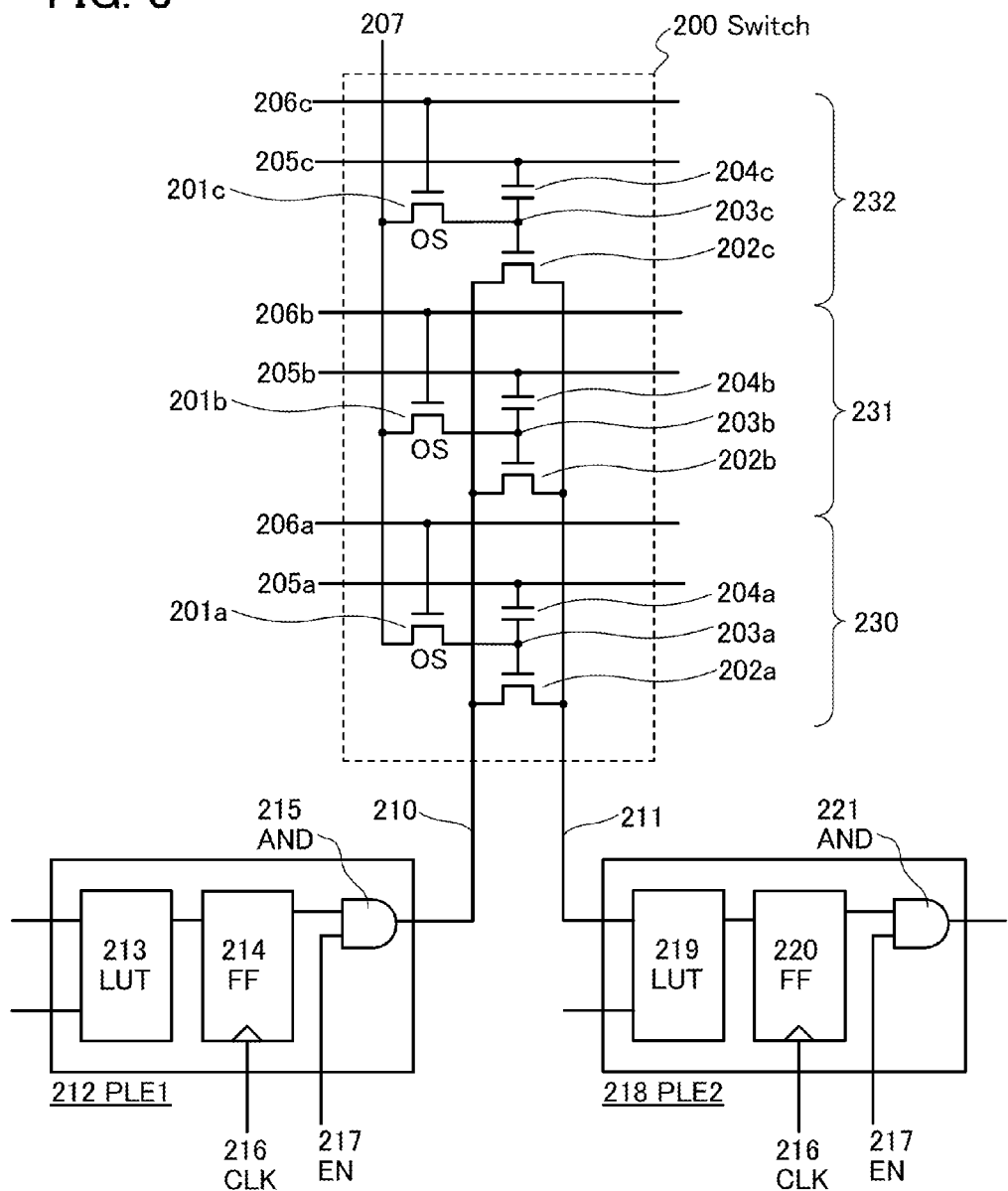
FIG. 3 is a circuit diagram illustrating one embodiment of a semiconductor device.

FIG. 3 illustrates a switch 200 in this embodiment. The switch 200 corresponds to each of the switches 112 to 117 in FIG. 2 and controls connection between a programmable logic element 212 (denoted by PLE1 in FIG. 3) and a programmable logic element 218 (denoted by PLE2 in FIG. 3) in a PLD. Each of the programmable logic elements 212 and 218 corresponds to one of the plurality of programmable logic elements 102 in FIG. 1 and includes a combinational circuit, a flip-flop, a logic element, and/or the like. A combinational circuit is composed of a lookup table, an AND-OR circuit, or the like and can be reconfigured in accordance with configuration data. For example, in FIG. 3, the programmable logic element 212 includes a lookup table 213, a flip-flop 214, and an AND circuit 215, and the programmable logic element 218 includes a lookup table 219, a flip-flop 220, and an AND circuit 221. The same clock signal is input to the flip-flops 214 and 220 from a wiring 216 and used for synchronization of the programmable logic elements 212 and 218. The same enable signal is input to the AND circuits 215 and 221 from a wiring 217.

The switch 200 is composed of a circuit having three groups each including a first transistor, a second transistor, and a capacitor. For the first transistor, a semiconductor material that has a wider band gap and lower intrinsic carrier density than silicon is used. An example of such a material is an oxide semiconductor. In FIG. 3, the symbol "OS" representing an oxide semiconductor is given below the transistors in which an oxide semiconductor is employed. An oxide semiconductor is used for a channel formation region of the first transistor. Meanwhile, the second transistor is preferably a transistor that uses a semiconductor material such as silicon, for example, for a channel formation region and thus can operate at higher speed than the first transistor. In this embodiment, the second transistor is specifically an n-channel transistor.

As illustrated in FIG. 3, the switch 200 specifically includes first transistors 201a, 201b, and 201c, second transistors 202a, 202b, and 202c, and capacitors 204a, 204b, and 204c. Gates of the first transistors 201a, 201b, and 201c are electrically connected to respective wirings 206a, 206b, and 206c. A write signal is input to the wirings 206a to 206c. Sources of the first transistors 201a to 201c are electrically connected to a common wiring 207. A write data signal is input to the wiring 207. Drains of the first transistors 201a, 201b, and 201c are electrically connected to respective gates of the second transistors 202a, 202b, and 202c. The drains of the first transistors 201a, 201b, and 201c are also electrically connected to one of a pair of electrodes of the capacitor 204a, one of a pair of electrodes of the capacitor 204b, and one of a pair of electrodes of the capacitor 204c, respectively. The second transistors 202a to 202c are electrically connected in parallel with each other. That is, sources of the second transistors 202a to 202c are connected to each other, and drains of the second transistors 202a to 202c are connected to each other. The sources of the second transistors 202a to 202c are electrically connected to an output terminal of the programmable logic element 212 through a wiring 210. The drains of the second transistors 202a to 202c are electrically connected to an input terminal of the programmable logic element 218 through a wiring 211. The other of the pair of electrodes of the capacitor 204a is electrically connected to a wiring 205a to which a selection signal is input. The other of the pair of electrodes of the capacitor 204b is electrically connected to a wiring 205b to which a selection signal is input. The other of the pair of electrodes of the capacitor 204c is electrically connected to a wiring 205c to which a selection signal is input. Here, points where the drains of the first transistors 201a, 201b, and 201c are electrically connected to the respective gates of the second transistors 202a, 202b, and 202c and the respective electrodes of the capacitors 204a, 204b, and 204c are respectively referred to as nodes 203a, 203b, and 203c. Configuration data is stored at the nodes 203a to 203c.

In this manner, the switch 200 in this embodiment consists of three groups 230, 231, and 232 each including the first and second transistors and the capacitor.

An output signal of the programmable logic element 212 is output to the wiring 210, supplied to the wiring 211 through the switch 200, and input to the programmable logic element 218.

When the potentials of the wirings 206a to 206c are set high ("H") and a potential corresponding to "H" or low ("L") is supplied to the wiring 207, charges corresponding to the potential of the wiring 207 can be stored at the nodes 203a to 203c, respectively. Note that at this time, at least one of the wirings 210 and 211 is preferably set "L".

Here, with the use of a transistor with extremely low off-state current as the first transistors 201a to 201c, the charge stored at the nodes 203a to 203c can be kept constant while the wirings 206a to 206c are at "L". That is, inputted data can be stored. When the wirings 206a to 206c are set "L" and the wirings 205a to 205c are set "H", the on/off states of the second transistors 202a to 202c are changed in accordance with the charge stored at the respective nodes 203a to 203c. In other words, by selecting one of the wirings 205a to 205c, the on/off state of the switch 200 can be switched instantly in accordance with the charge stored at the node 203a, the node 203b, or the node 203c.

Here, when the charge stored at the nodes 203a, 203b, and 203c are related to first configuration data, second configuration data, and third configuration data, respectively, configuration data can be switched by switching between the wirings 205a, 205b, and 205c.

Such a structure can reduce time for reading data from a memory device that stores plural pieces of configuration data. Consequently, the PLD in which configuration data can be switched at high speed can be provided.

A latch is preferably provided at the wiring 211 because when a signal passes through the switch 200, the potential of the signal is sometimes lowered depending on the resistance of the switch. The latch can be composed of an inverter and a pull-up transistor.

FIG. 3 illustrates the case where one switch is provided between the programmable logic elements; alternatively, a plurality of switches can be connected in series between the programmable logic elements. Alternatively, a cross-point switch that controls connection between plural wirings and plural wirings can be formed by applying this structure. In the case where a signal passes through a plurality of switches, the potential of the signal is sometimes lowered depending on the resistance of the switches.

Figure 12A:
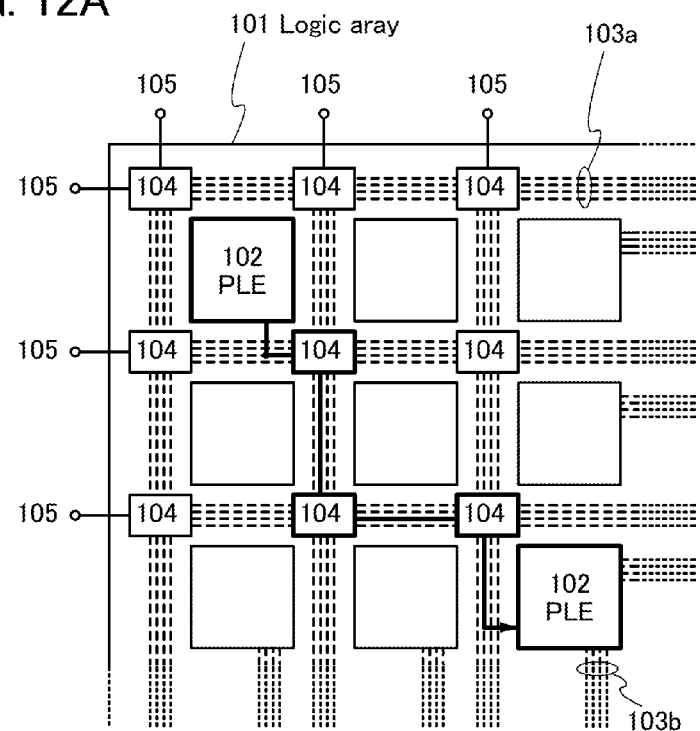
FIGS. 12A to 12C are circuit diagrams illustrating one embodiment of a semiconductor device.

As an example, FIG. 12A illustrates the case where a plurality of switches are provided between programmable logic elements. By setting configuration data, the upper-left programmable logic element 102 can be electrically connected to the lower-right programmable logic element 102, for example. In this case, these programmable logic elements 102 are electrically connected to each other through three switch boxes 104; thus, a signal passes through at least three switches connected in series. Therefore, in order to prevent the decrease in potential of the signal due to the switch resistance, latches are preferably positioned at every predetermined number of switches.

Figure 12B:
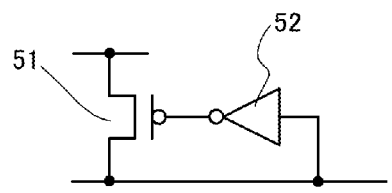
Figure 12C:
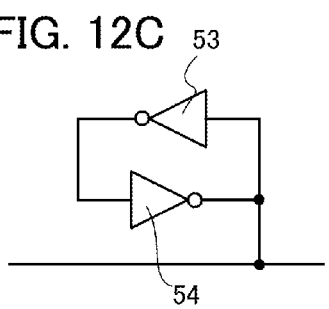

As illustrated in FIG. 12B, the latch can be configured by electrically connecting an output terminal of an inverter 52 to an input terminal of a pull-up transistor 51. Moreover, as illustrated in FIG. 12C, the latch can be configured by connecting an output terminal of an inverter 54 to an input terminal of an inverter 53 and connecting an input terminal of the inverter 54 to an output terminal of the inverter 53.

(Operation of Switch 200)

Next, an example of a method of operating the switch 200 illustrated in FIG. 3 will be described with reference to a timing chart in FIG. 4.

Here, as an example, the potentials of the wirings 206a to 206c at "H" are +V and the potentials of the wirings 206a to 206c at "L" are −V. The potentials of the wirings 205a to 205c at "H" are +V and the potentials of the wirings 205a to 205c at "L" are 0. The potential of the wiring 207 at "H" is +V and the potential of the wiring 207 at "L" is 0. The potentials of the wirings 210, 211, 216, and 217 at "H" are +V and the potentials of the wirings 210, 211, 216, and 217 at "L" are 0.

As an initial state, the case where the wiring 205c is at "H" and the potential of the node 203c is +V is considered. In other words, the on/off state of the switch 200 is determined in accordance with the third configuration data, and the switch 200 is on in the initial state. Further, the potentials of the nodes 203a and 203b are −V in the initial state.

First, write of configuration data (time T1 to time T6) is described.

At the time T2, the wirings 206a and 205a are set "H", the wiring 217 is set "L", and the wiring 207 is "L". At this time, the potential of the node 203a becomes 0; this potential corresponds to a potential for turning off the switch 200. That is, this state corresponds to a state where the switch 200 stores "L" as the first configuration data. Note that the output of the programmable logic element 212 is "L".

At the time T3, the wirings 206a and 205a are set "L". At this time, the potential of the node 203a becomes −V.

At the time T5, the wirings 206b and 205b are set "H", the wiring 217 is set "L", and the wiring 207 is "H". At this time, the potential of the node 203b becomes +V; this potential corresponds to a potential for turning on the switch 200. That is, this state corresponds to a state where the switch 200 stores "H" as the second configuration data. Note that the output of the programmable logic element 212 is "L".

At the time T6, the wirings 206b and 205b are set "L". At this time, the potential of the node 203b becomes 0.

Note that it is preferable that write of configuration data be finished in a time as short as possible and as soon as possible after the time T1 and the time T4 each of which is the time of a positive edge of the clock signal input to the wiring 216. Specifically, it is preferable that write of configuration data be started after a hold time of the flip-flop passes from the time T1 and the time T4. With such a structure, configuration data can be rewritten without disturbing the operation of the PLD.

Next, switching of configuration data (time T7 to time T10) is described.

At the time T8, the wiring 205a is set "H", and the wiring 205c is set "L". At this time, the potential of the node 203a becomes 0, and the potential of the node 203c becomes 0. Thus, the switch 200 is turned off, which means that switching to the first configuration data is completed.

At the time T10, the wiring 205a is set "L", and the wiring 205b is set "H". At this time, the potential of the node 203a becomes −V, and the potential of the node 203b becomes +V. Thus, the switch 200 is turned on, which means that switching to the second configuration data is completed.

Note that it is preferable that switching of configuration data be performed as soon as possible after the time T7 and the time T9 each of which is the time of a positive edge of the clock signal input to the wiring 216. Specifically, it is preferable that switching of configuration data be performed after a hold time of the flip-flop passes from the time T7 and the time T9. With such a structure, configuration data can be switched without impairing the operation of the PLD.

With the above-described structure, it is possible to provide a low power consumption PLD that achieves high-speed configuration capable of dynamic configuration and has a short startup time.

Figure 4:
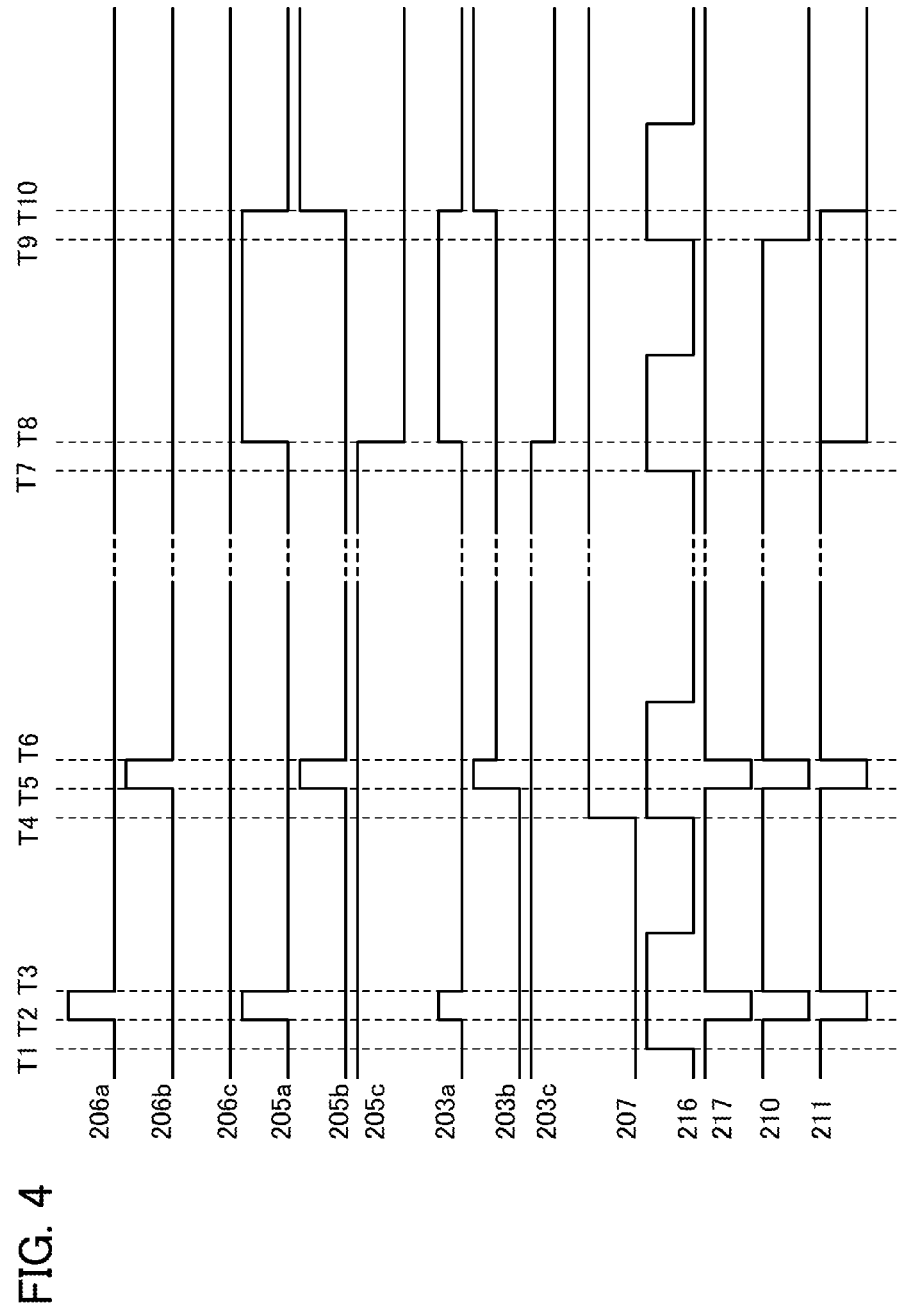
FIG. 4 is a timing chart illustrating one embodiment of a circuit operation.

In the method of operating the switch 200 in FIG. 4, the potentials of the wirings 205a to 205c are changed to write configuration data into the nodes 203a to 203c. However, configuration data can be written without change in the potentials of the wirings 205a to 205c when the gate capacitance of the second transistors 202a to 202c is sufficiently larger than the source-gate capacitance and drain-gate capacitance or when an additional storage capacitor is electrically connected to the gates of the second transistors 202a to 202c and the gate capacitance and storage capacitance are sufficiently larger than the source-gate capacitance and drain-gate capacitance.

Further, in the method of operating the switch 200 in FIG. 4, an enable signal 0 is input to the wiring 217 (the output of the programmable logic element 212 is 0) to write configuration data into the nodes 203a to 203c. However, configuration data can be written with the enable signal input to the wiring 217 remaining at 1 (without setting the output of the programmable logic element 212 at 0) when the gate capacitance of the second transistors 202a to 202c is sufficiently larger than the source-gate capacitance and drain-gate capacitance or when an additional storage capacitor is electrically connected to the gates of the second transistors 202a to 202c and the gate capacitance and storage capacitance are sufficiently larger than the source-gate capacitance and drain-gate capacitance.

This embodiment can be combined with any of the other embodiments as appropriate.

(Embodiment 2)

In Embodiment 2, a switch 300 in which the n-channel second transistors used in the switch 200 shown in Embodiment 1 are replaced with p-channel second transistors will be described with reference to FIG. 5 and FIG. 6.

(Structure of Switch 300)

Figure 5:
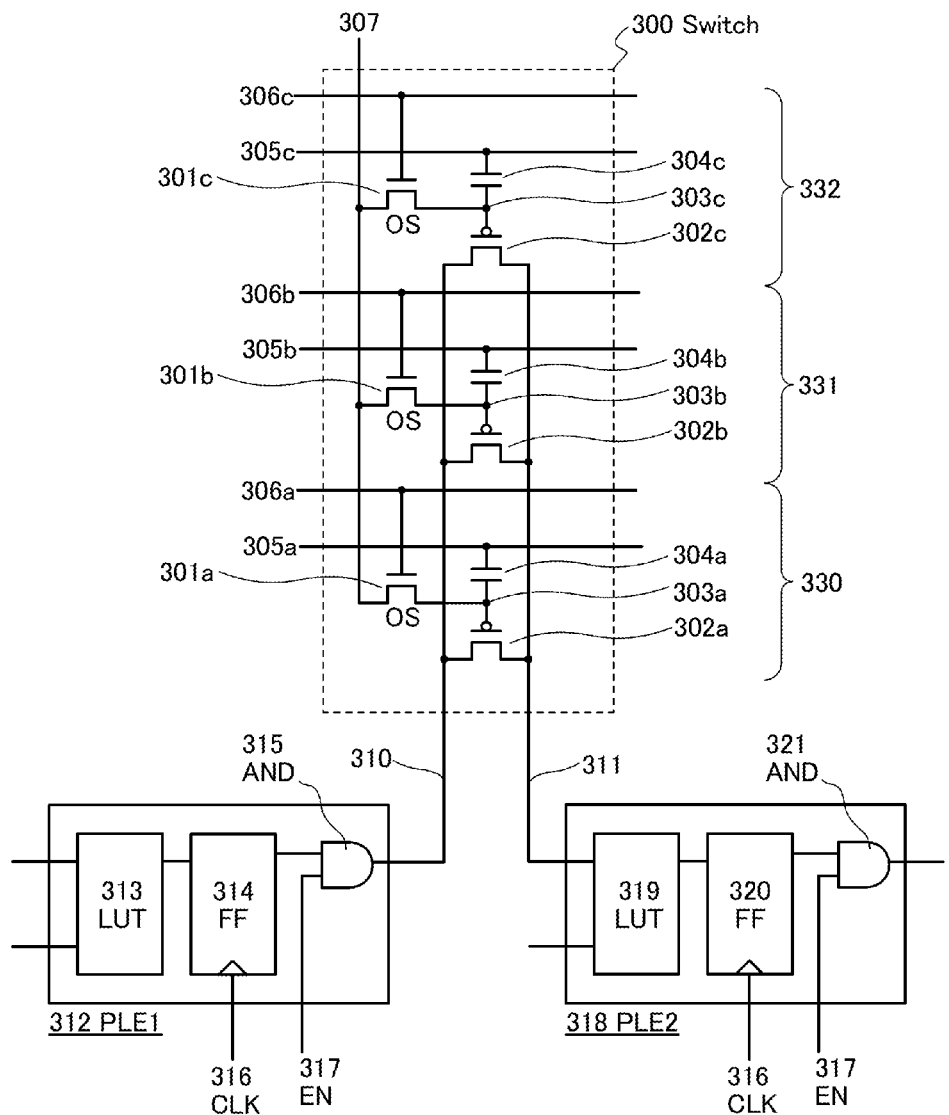
FIG. 5 is a circuit diagram illustrating one embodiment of a semiconductor device.

FIG. 5 illustrates the switch 300 in this embodiment. The switch 300 corresponds to each of the switches 112 to 117 in FIG. 2 and its structure is the same as that of the switch 200 described in Embodiment 1 except that the n-channel second transistors 202a to 202c are replaced with transistors with opposite polarity, that is, p-channel second transistors 302a to 302c.

The switch 300 controls connection between a programmable logic element 312 and a programmable logic element 318 in a PLD. Each of the programmable logic elements 312 and 318 corresponds to one of the plurality of programmable logic elements 102 in FIG. 1. For example, in FIG. 5, the programmable logic element 312 can be composed of a lookup table 313, a flip-flop 314, and an AND circuit 315, and the programmable logic element 318 can be composed of a lookup table 319, a flip-flop 320, and an AND circuit 321.

Like the switch 200 described in Embodiment 1, the switch 300 is composed of a circuit having three groups each including a first transistor, a second transistor, and a capacitor. For the first transistor, a semiconductor material that has a wider band gap and lower intrinsic carrier density than silicon is used. An oxide semiconductor is used for a channel formation region of the first transistor. Meanwhile, the second transistor is preferably a transistor that uses a semiconductor material such as silicon, for example, for a channel formation region and thus can operate at higher speed than the first transistor. In this embodiment, the second transistor is specifically a p-channel transistor.

As illustrated in FIG. 5, the switch 300 specifically includes first transistors 301a, 301b, and 301c, second transistors 302a, 302b, and 302c, and capacitors 304a, 304b, and 304c. Gates of the first transistors 301a, 301b, and 301c are electrically connected to respective wirings 306a, 306b, and 306c. A write signal is input to the wirings 306a to 306c. Sources of the first transistors 301a to 301c are electrically connected to a common wiring 307. A write data signal is input to the wiring 307. Drains of the first transistors 301a, 301b, and 301c are electrically connected to respective gates of the second transistors 302a, 302b, and 302c. The drains of the first transistors 301a, 301b, and 301c are also electrically connected to one of a pair of electrodes of the capacitor 304a, one of a pair of electrodes of the capacitor 304b, and one of a pair of electrodes of the capacitor 304c, respectively. The p-channel second transistors 302a to 302c are electrically connected in parallel with each other. That is, sources of the second transistors 302a to 302c are connected to each other, and drains of the second transistors 302a to 302c are connected to each other. The sources of the second transistors 302a to 302c are electrically connected to an output terminal of the programmable logic element 312 through a wiring 310. The drains of the second transistors 302a to 302c are electrically connected to an input terminal of the programmable logic element 318 through a wiring 311. The other of the pair of electrodes of the capacitor 304a is electrically connected to a wiring 305a to which a selection signal is input. The other of the pair of electrodes of the capacitor 304b is electrically connected to a wiring 305b to which a selection signal is input. The other of the pair of electrodes of the capacitor 304c is electrically connected to a wiring 305c to which a selection signal is input. Here, points where the drains of the first transistors 301a, 301b, and 301c are electrically connected to the respective gates of the second transistors 302a, 302b, and 302c and the respective electrodes of the capacitors 304a, 304b, and 304c are respectively referred to as nodes 303a, 303b, and 303c. Configuration data is stored at the nodes 303a to 303c.

In this manner, the switch 300 in this embodiment consists of three groups 330, 331, and 332 each including the first and second transistors and the capacitor.

An output signal of the programmable logic element 312 is output to the wiring 310, supplied to the wiring 311 through the switch 300, and input to the programmable logic element 318.

When the potentials of the wirings 306a to 306c are set high ("H") and a potential corresponding to "H" or low ("L") is supplied to the wiring 307, charges corresponding to the potential of the wiring 307 can be stored at the nodes 303a to 303c, respectively. Note that at this time, at least one of the wirings 310 and 311 is preferably set "L".

Here, with the use of a transistor with extremely low off-state current as the first transistors 301a to 301c, the charge stored at the nodes 303a to 303c can be kept constant while the wirings 306a to 306c are at "L". That is, inputted data can be stored. When the wirings 306a to 306c are set "L" and the wirings 305a to 305c are set "L", the on/off states of the second transistors 302a to 302c are changed in accordance with the charge stored at the respective nodes 303a to 303c. In other words, by selecting one of the wirings 305a to 305c, the on/off state of the switch 300 can be switched instantly in accordance with the charge stored at the node 303a, the node 303b, or the node 303c.

Here, when the charge stored at the nodes 303a, 303b, and 303c are related to first configuration data, second configuration data, and third configuration data, respectively, configuration data can be switched by switching between the wirings 305a, 305b, and 305c.

Such a structure can reduce time for reading data from a memory device that stores plural pieces of configuration data. Consequently, the PLD in which configuration data can be switched at high speed can be provided.

When a signal passes through the switch 300, the potential of the signal is sometimes lowered depending on the resistance of the switch. Latches for preventing the potential decrease can be arranged as described in Embodiment 1.

(Operation of Switch 300)

Next, an example of a method of operating the switch 300 illustrated in FIG. 5 will be described with reference to a timing chart in FIG. 6.

Here, as an example, the potentials of the wirings 306a to 306c at "H" are +V and the potentials of the wirings 306a to 306c at "L" are 0. The potentials of the wirings 305a to 305c at "H" are +V and the potentials of the wirings 305a to 305c at "L" are 0. The potential of the wiring 307 at "H" is +V and the potential of the wiring 307 at "L" is 0. The potentials of the wirings 310, 311, 316, and 317 at "H" are +V and the potentials of the wirings 310, 311, 316, and 317 at "L" are 0.

As an initial state, the case where the wiring 305c is at "L" and the potential of the node 303c is 0 is considered. In other words, the on/off state of the switch 300 is determined in accordance with the third configuration data, and the switch 300 is on in the initial state. Further, the potentials of the nodes 303a and 303b are +2 V in the initial state.

First, write of configuration data (time T1 to time T6) is described.

At the time T2, the wiring 306a is set "H", the wiring 305a is set "L", the wiring 317 is set "L", and the wiring 307 is "H". At this time, the potential of the node 303a becomes +V; this potential corresponds to a potential for turning off the switch 300. That is, this state corresponds to a state where the switch 300 stores "H" as the first configuration data. Note that the output of the programmable logic element 312 is "L".

At the time T3, the wiring 306a is set "L" and the wiring 305a is set "H". At this time, the potential of the node 303a becomes +2 V.

At the time T5, the wiring 306b is set "H", the wiring 305b is set "L", the wiring 317 is set "L", and the wiring 307 is "L". At this time, the potential of the node 303b becomes 0; this potential corresponds to a potential for turning on the switch 300. That is, this state corresponds to a state where the switch 300 stores "H" as the second configuration data. Note that the output of the programmable logic element 312 is "L".

At the time T6, the wiring 306b is set "L" and the wiring 305b is set "H". At this time, the potential of the node 303b becomes +V.

Note that it is preferable that write of configuration data be finished in a time as short as possible and as soon as possible after the time T1 and the time T4 each of which is the time of a positive edge of the clock signal input to the wiring 316. Specifically, it is preferable that write of configuration data be started after a hold time of the flip-flop passes from the time T1 and the time T4. With such a structure, configuration data can be rewritten without disturbing the operation of the PLD.

Next, switching of configuration data (time T7 to time T10) is described.

At the time T8, the wiring 305a is set "L", and the wiring 305c is set "H". At this time, the potential of the node 303a becomes +V, and the potential of the node 303c becomes +V. Thus, the switch 300 is turned off, which means that switching to the first configuration data is completed.

At the time T10, the wiring 305a is set "H", and the wiring 305b is set "L". At this time, the potential of the node 303a becomes +2 V, and the potential of the node 303b becomes 0. Thus, the switch 300 is turned on, which means that switching to the second configuration data is completed.

Note that it is preferable that switching of configuration data be performed as soon as possible after the time T7 and the time T9 each of which is the time of a positive edge of the clock signal input to the wiring 316. Specifically, it is preferable that switching of configuration data be performed after a hold time of the flip-flop passes from the time T7 and the time T9. With such a structure, configuration data can be switched without disturbing the operation of the PLD.

With the above-described structure, it is possible to provide a low power consumption PLD that achieves high-speed configuration capable of dynamic configuration and has a short startup time.

It is worth noting that a potential of "−V" is not needed in the switch 300 of this embodiment because the second transistor is a p-channel transistor. For this reason, the number of power supply voltages can be reduced as compared to the switch 200 described in Embodiment 1. On the other hand, since a p-channel transistor is used as the second transistor in the switch 300, there is generally a possibility that the switching speed of the switch 300 is lower than that of the switch 200 including the n-channel second transistor described in Embodiment 1. Accordingly, it is preferable to select the switch 200 or the switch 300 as appropriate depending on the intended use.

Figure 6:
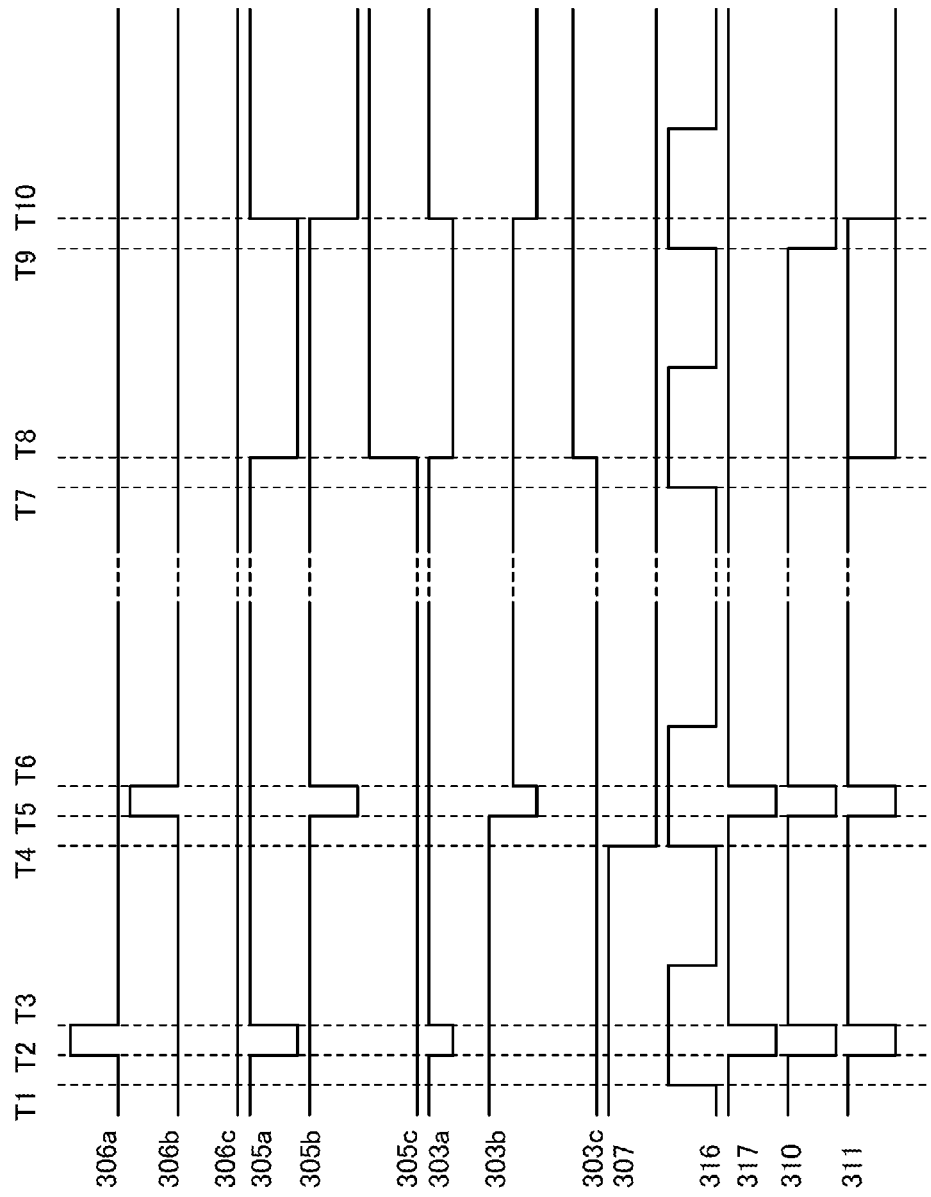
FIG. 6 is a timing chart illustrating one embodiment of a circuit operation.

In the method of operating the switch 300 in FIG. 6, the potentials of the wirings 305a to 305c are changed to write configuration data into the nodes 303a to 303c. However, configuration data can be written without change in the potentials of the wirings 305a to 305c when the gate capacitance of the second transistors 302a to 302c is sufficiently larger than the source-gate capacitance and drain-gate capacitance or when an additional storage capacitor is electrically connected to the gates of the second transistors 302a to 302c and the gate capacitance and storage capacitance are sufficiently larger than the source-gate capacitance and drain-gate capacitance.

Further, in the method of operating the switch 300 in FIG. 6, an enable signal 0 is input to the wiring 317 (the output of the programmable logic element 312 is 0) to write configuration data into the nodes 303a to 303c. However, configuration data can be written with the enable signal input to the wiring 317 remaining at 1 (without setting the output of the programmable logic element 312 at 0) when the gate capacitance of the second transistors 302a to 302c is sufficiently larger than the source-gate capacitance and drain-gate capacitance or when an additional storage capacitor is electrically connected to the gates of the second transistors 302a to 302c and the gate capacitance and storage capacitance are sufficiently larger than the source-gate capacitance and drain-gate capacitance.

This embodiment can be combined with any of the other embodiments as appropriate.

(Embodiment 3)

Embodiment 1 shows the switch 200 using three groups each including a first transistor, a second transistor, and a capacitor, whereas Embodiment 3 will explain a switch 400 including at least three groups (hereinafter referred to as N groups, where N is an integer of 3 or more) of these elements with reference to FIG. 7.

The switch 400 corresponds to each of the switches 112 to 117 in FIG. 2 and controls connection between a programmable logic element 412 and a programmable logic element 418 in a PLD. Each of the programmable logic elements 412 and 418 corresponds to one of the plurality of programmable logic elements 102 in FIG. 1. For example, in FIG. 7, the programmable logic element 412 can be composed of a lookup table 413, a flip-flop 414, and an AND circuit 415, and the programmable logic element 418 can be composed of a lookup table 419, a flip-flop 420, and an AND circuit 421.

As in the switch 200 described in Embodiment 1, the first transistor in the switch 400 uses a semiconductor material that has a wider band gap and lower intrinsic carrier density than silicon. An oxide semiconductor is used for a channel formation region of the first transistor. Meanwhile, the second transistor is preferably a transistor that uses a semiconductor material such as silicon, for example, for a channel formation region and thus can operate at higher speed than the first transistor. In this embodiment, the second transistor is specifically an n-channel transistor.

Figure 7:
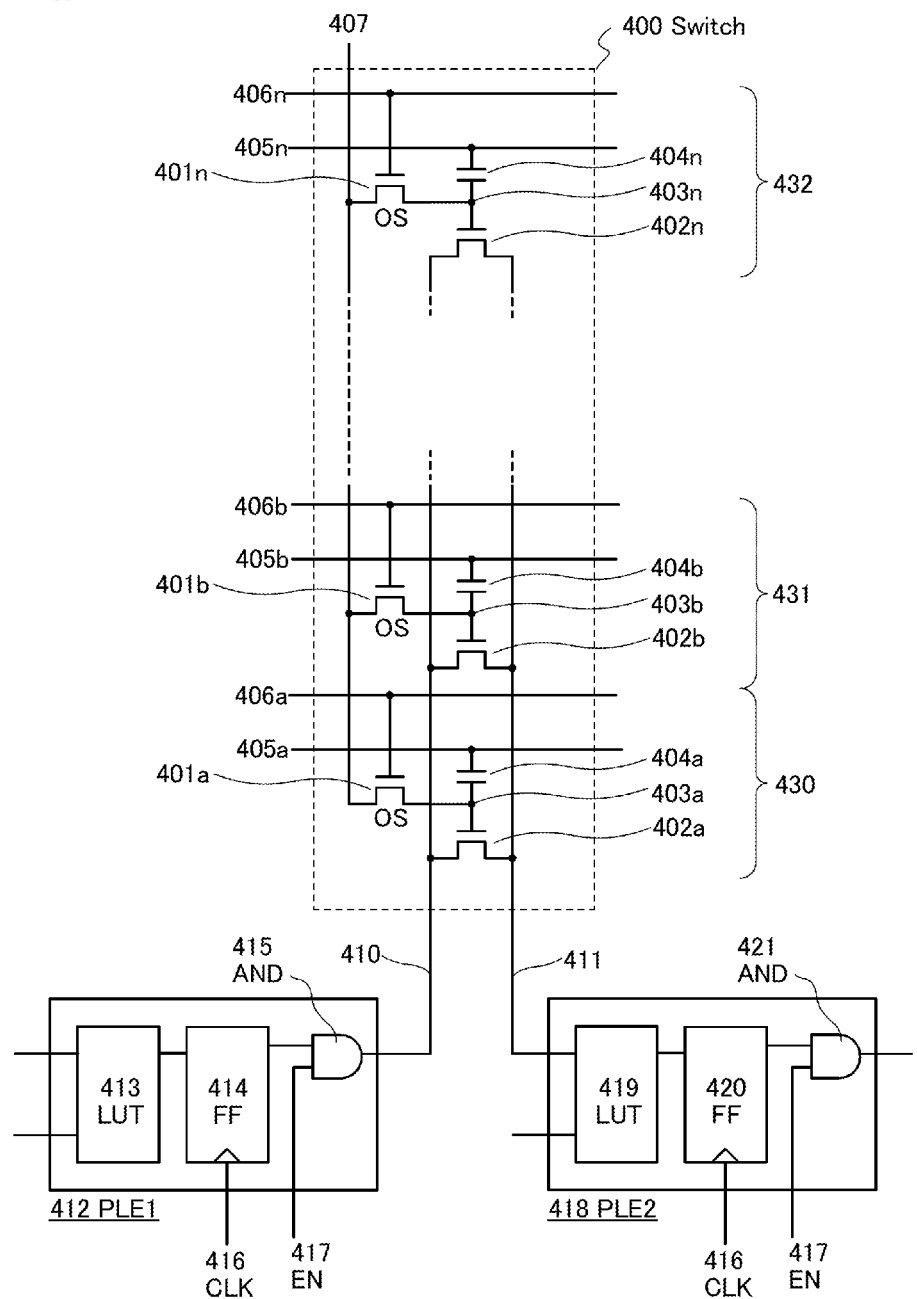
FIG. 7 is a circuit diagram illustrating one embodiment of a semiconductor device.

As illustrated in FIG. 7, the switch 400 specifically includes a first transistor 401a in the first group, a first transistor 401b in the second group, and a first transistor 401n in the N-th group (first transistors in the third to (N−1)th groups are not shown); a second transistor 402a in the first group, a second transistor 402b in the second group, and a second transistor 402n in the N-th group (second transistors in the third to (N−1)th groups are not shown); and a capacitor 404a in the first group, a capacitor 404b in the second group, and a capacitor 404n in the N-th group (capacitors in the third to (N−1)th groups are not shown).

Gates of the first transistors 401a, 401b, and 401n are electrically connected to respective wirings 406a, 406b, and 406n. A write signal is input to the wirings 406a, 406b, and 406n. Sources of the first transistors 401a, 401b, and 401n are electrically connected to a common wiring 407. A write data signal is input to the wiring 407. Drains of the first transistors 401a, 401b, and 401n are electrically connected to respective gates of the second transistors 402a, 402b, and 402n. The drains of the first transistors 401a, 401b, and 401n are also electrically connected to one of a pair of electrodes of the capacitor 404a, one of a pair of electrodes of the capacitor 404b, and one of a pair of electrodes of the capacitor 404n, respectively. The p-channel second transistors 402a, 402b, and 402n are electrically connected in parallel with each other. That is, sources of the second transistors 402a, 402b, and 402n are connected to each other, and drains of the second transistors 402a, 402b, and 402n are connected to each other. The sources of the second transistors 402a, 402b, and 402n are electrically connected to an output terminal of the programmable logic element 412 through a wiring 410. The drains of the second transistors 402a, 402b, and 402n are electrically connected to an input terminal of the programmable logic element 418 through a wiring 411. The other of the pair of electrodes of the capacitor 404a is electrically connected to a wiring 405a to which a read signal is input. The other of the pair of electrodes of the capacitor 404b is electrically connected to a wiring 405b to which a read signal is input. The other of the pair of electrodes of the capacitor 404n is electrically connected to a wiring 405n to which a read signal is input. Here, points where the drains of the first transistors 401a, 401b, and 401n are electrically connected to the respective gates of the second transistors 402a, 402b, and 402n and the respective electrodes of the capacitors 404a, 404b, and 404n are respectively referred to as nodes 403a, 403b, and 403n. Configuration data is stored at the nodes 403a, 403b, and 403n.

In this manner, the switch 400 in this embodiment consists of N groups including groups 430, 431, and 432 each of which includes the first and second transistors and the capacitor.

An output signal of the programmable logic element 412 is output to the wiring 410, supplied to the wiring 411 through the switch 400, and input to the programmable logic element 418.

Note that the switch 400 can operate as appropriate according to the operation described in Embodiment 1.

Such a structure can reduce time for reading data from a memory device that stores plural pieces of configuration data. Consequently, the PLD in which configuration data can be switched at high speed can be provided.

It is worth noting that the switch 400 shown in this embodiment can store plural pieces of configuration data at a time and is thus effective in changing the circuit structure of a PLD many times in a short time. Note that the optimum number of groups included in the switch 400 can be selected as appropriate depending on the intended use.

This embodiment can be combined with any of the other embodiments as appropriate.

(Embodiment 4)

Figure 8:
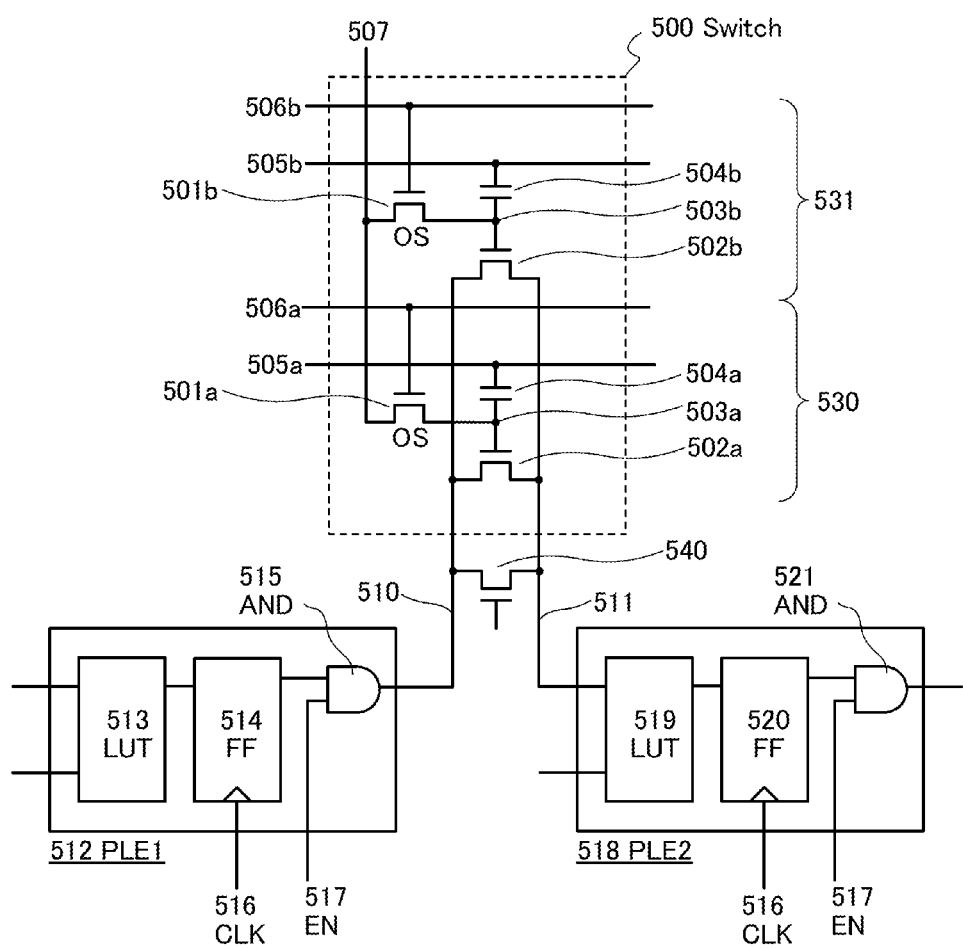
FIG. 8 is a circuit diagram illustrating one embodiment of a semiconductor device.

Embodiment 1 shows the switch 200 using three groups each including a first transistor, a second transistor, and a capacitor, whereas Embodiment 4 will explain a switch 500 including only two groups of these elements with reference to FIG. 8.

The switch 500 corresponds to each of the switches 112 to 117 in FIG. 2 and controls connection between a programmable logic element 512 and a programmable logic element 518 in a PLD. Each of the programmable logic elements 512 and 518 corresponds to one of the plurality of programmable logic elements 102 in FIG. 1. For example, in FIG. 8, the programmable logic element 512 can be composed of a lookup table 513, a flip-flop 514, and an AND circuit 515, and the programmable logic element 518 can be composed of a lookup table 519, a flip-flop 520, and an AND circuit 521.

As in the switch 200 described in Embodiment 1, the first transistor in the switch 500 uses a semiconductor material that has a wider band gap and lower intrinsic carrier density than silicon. An oxide semiconductor is used for a channel formation region of the first transistor. Meanwhile, the second transistor is preferably a transistor that uses a semiconductor material such as silicon, for example, for a channel formation region and thus can operate at higher speed than the first transistor. In this embodiment, the second transistor is specifically an n-channel transistor.

As illustrated in FIG. 8, the switch 500 specifically includes first transistors 501a and 501b, second transistors 502a and 502b, and capacitors 504a and 504b. Gates of the first transistors 501a and 501b are electrically connected to respective wirings 506a and 506b. A write signal is input to the wirings 506a and 506b. Sources of the first transistors 501a and 501b are electrically connected to a common wiring 507. A write data signal is input to the wiring 507. Drains of the first transistors 501a and 501b are electrically connected to respective gates of the second transistors 502a and 502b. The drains of the first transistors 501a and 501b are also electrically connected to one of a pair of electrodes of the capacitor 504a and one of a pair of electrodes of the capacitor 504b, respectively. The second transistors 502a and 502b are electrically connected in parallel with each other. That is, sources of the second transistors 502a and 502b are connected to each other, and drains of the second transistors 502a and 502b are connected to each other. The sources of the second transistors 502a and 502b are electrically connected to an output terminal of the programmable logic element 512 through a wiring 510. The drains of the second transistors 502a and 502b are electrically connected to an input terminal of the programmable logic element 518 through a wiring 511. The other of the pair of electrodes of the capacitor 504a is electrically connected to a wiring 505a to which a read signal is input. The other of the pair of electrodes of the capacitor 504b is electrically connected to a wiring 505b to which a read signal is input. Here, points where the drains of the first transistors 501a and 501b are electrically connected to the respective gates of the second transistors 502a and 502b and the respective electrodes of the capacitors 504a and 504b are respectively referred to as nodes 503a and 503b. Configuration data is stored at the nodes 503a and 503b.

In this manner, the switch 500 in this embodiment consists of two groups 530 and 531 each including the first and second transistors and the capacitor.

An output signal of the programmable logic element 512 is output to the wiring 510, supplied to the wiring 511 through the switch 500, and input to the programmable logic element 518.

Such a structure can reduce time for reading data from a memory device that stores plural pieces of configuration data. Consequently, the PLD in which configuration data can be switched at high speed can be provided.

It is worth noting that the switch 500 can operate as appropriate according to the operation described in Embodiment 1, and configuration data in one of the groups 530 and 531 that is not selected can be changed in a period during which the other of the groups 530 and 531 is selected. Accordingly, by sequentially setting configuration data in non-selected groups again, a switch having only two groups can achieve a PLD.

Note that in the switch 500 described in this embodiment, as illustrated in FIG. 8, a transistor 540 may be provided between the wiring 510 and the wiring 511 so that the programmable logic elements 512 and 518 are short-circuited when configuration data is written into the nodes 503a and 503b. With such a structure, the nodes 503a and 503b can stably store configuration data.

This embodiment can be combined with any of the other embodiments as appropriate.

(Embodiment 5)

In Embodiment 5, a switch 600 that does not use the capacitor included in the switch 200 of Embodiment 1 and additionally includes a third transistor will be described with reference to FIG. 9 and FIG. 10.

(Structure of Switch 600)

Figure 9:
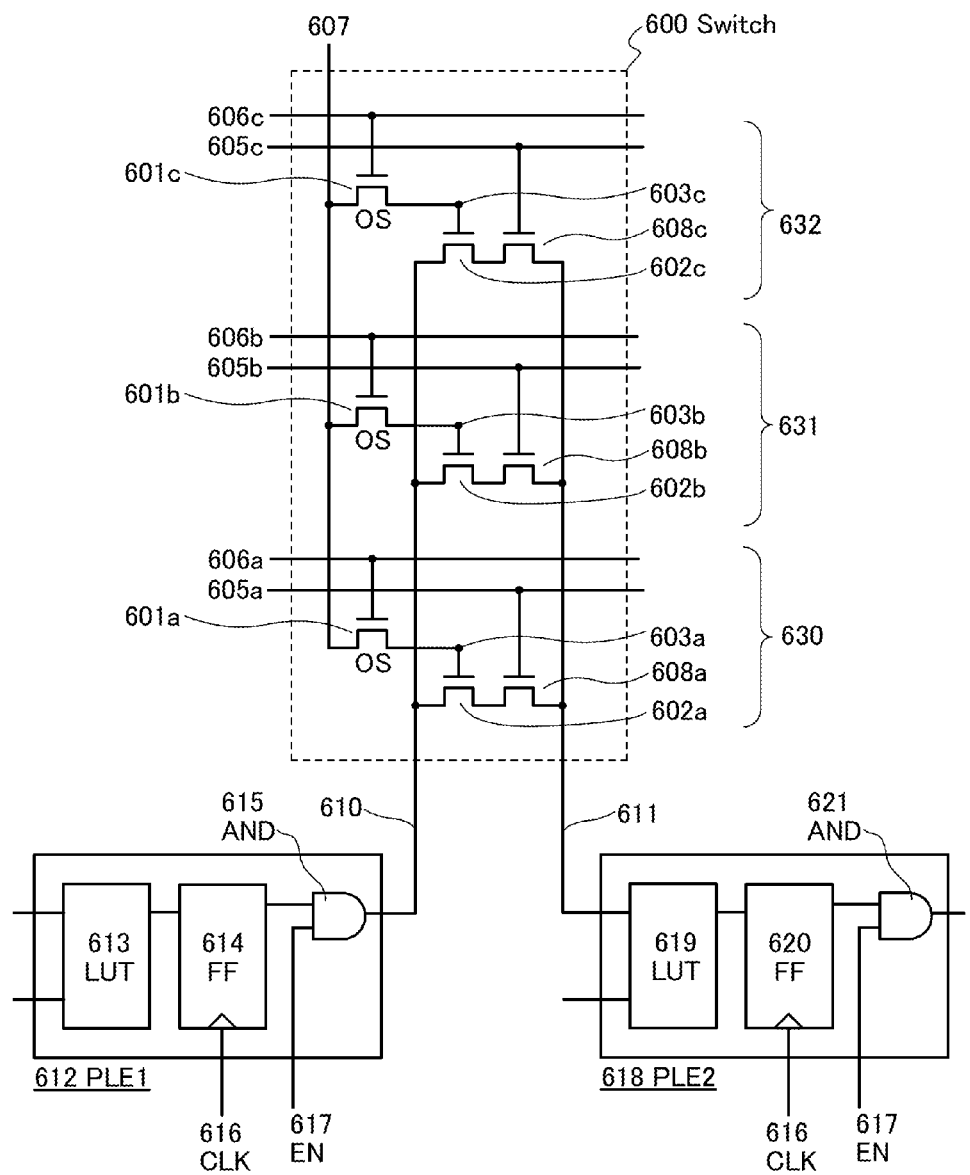
FIG. 9 is a circuit diagram illustrating one embodiment of a semiconductor device.

FIG. 9 illustrates the switch 600 in this embodiment. The switch 600 corresponds to each of the switches 112 to 117 in FIG. 2 and controls connection between a programmable logic element 612 and a programmable logic element 618 in a PLD. Each of the programmable logic elements 612 and 618 corresponds to one of the plurality of programmable logic elements 102 in FIG. 1. For example, in FIG. 9, the programmable logic element 612 can be composed of a lookup table 613, a flip-flop 614, and an AND circuit 615, and the programmable logic element 618 can be composed of a lookup table 619, a flip-flop 620, and an AND circuit 621.

The switch 600 is composed of a circuit having three groups each including a first transistor, a second transistor, and a third transistor. For the first transistor, a semiconductor material that has a wider band gap and lower intrinsic carrier density than silicon is used. An oxide semiconductor is used for a channel formation region of the first transistor. Meanwhile, each of the second and third transistors is preferably a transistor that uses a semiconductor material such as silicon, for example, for a channel formation region and thus can operate at higher speed than the first transistor. In this embodiment, the second and third transistors are specifically n-channel transistors.

As illustrated in FIG. 9, the switch 600 specifically includes first transistors 601a, 601b, and 601c, second transistors 602a, 602b, and 602c, and third transistors 608a, 608b, and 608c. Gates of the first transistors 601a, 601b, and 601c are electrically connected to respective wirings 606a, 606b, and 606c. A write signal is input to the wirings 606a to 606c. Sources of the first transistors 601a to 601c are electrically connected to a common wiring 607. A write data signal is input to the wiring 607. Drains of the first transistors 601a, 601b, and 601c are electrically connected to respective gates of the second transistors 602a, 602b, and 602c. Drains of the second transistors 602a, 602b, and 602c are electrically connected to respective sources of the third transistors 608a, 608b, and 608c. As a result, the second transistors 602a, 602b, and 602c are electrically connected in series with the third transistors 608a, 608b, and 608c, respectively. Drains of the third transistors 608a to 608c are connected to each other. The sources of the second transistors 602a to 602c are electrically connected to an output terminal of the programmable logic element 612 through a wiring 610. The drains of the third transistors 608a to 608c are electrically connected to an input terminal of the programmable logic element 618 through a wiring 611. The gates of the third transistors 608a, 608b, and 608c are electrically connected to wirings 605a, 605b, and 605c, respectively. Here, points where the drains of the first transistors 601a, 601b, and 601c are electrically connected to the respective gates of the second transistors 602a, 602b, and 602c are respectively referred to as nodes 603a, 603b, and 603c. Configuration data is stored at the nodes 603a to 603c.

In this manner, the switch 600 in this embodiment consists of three groups 630, 631, and 632 each including the first, second, and third transistors.

An output signal of the programmable logic element 612 is output to the wiring 610, supplied to the wiring 611 through the switch 600, and input to the programmable logic element 618.

When the potentials of the wirings 606a to 606c are set high ("H") and a potential corresponding to "H" or low ("L") is supplied to the wiring 607, charges corresponding to the potential of the wiring 607 can be stored at the nodes 603a to 603c, respectively. Note that at this time, at least one of the wirings 610 and 611 is preferably set "L".

Here, with the use of a transistor with extremely low off-state current as the first transistors 601a to 601c, the charge stored at the nodes 603a to 603c can be kept constant while the wirings 606a to 606c are at "L". That is, inputted data can be stored. The wirings 606a to 606c are set "L" and the wirings 605a, 605b, and 605c are set "H" to turn on the third transistors 608a to 608c, whereby the on/off state of the switch 600 is determined by the on/off states of the second transistors 602a to 602c corresponding to the charge stored at the nodes 603a to 603c. In other words, by selecting one of the wirings 605a to 605c, the on/off state of the switch 600 can be switched instantly in accordance with the charge stored at the node 603a, the node 603b, or the node 603c.

Here, when the charge stored at the nodes 603a, 603b, and 603c are related to first configuration data, second configuration data, and third configuration data, respectively, configuration data can be switched by switching between the wirings 605a, 605b, and 605c.

Such a structure can reduce time for reading data from a memory device that stores plural pieces of configuration data.

Consequently, the PLD in which configuration data can be switched at high speed can be provided.

When a signal passes through the switch 600, the potential of the signal is sometimes lowered depending on the resistance of the switch. Latches for preventing the potential decrease can be arranged as described in Embodiment 1.

(Operation of Switch 600)

Next, an example of a method of operating the switch 600 illustrated in FIG. 9 will be described with reference to a timing chart in FIG. 10.

Here, as an example, the potentials of the wirings 606a to 606c at "H" are +V and the potentials of the wirings 606a to 606c at "L" are 0. The potentials of the wirings 605a to 605c at "H" are +V and the potentials of the wirings 605a to 605c at "L" are 0. The potential of the wiring 607 at "H" is +V and the potential of the wiring 607 at "L" is 0. The potentials of the wirings 610, 611, 616, and 617 at "H" are +V and the potentials of the wirings 610, 611, 616, and 617 at "L" are 0.

As an initial state, the case where the wiring 605c is at "H" and the potential of the node 603c is +V is considered. In other words, the on/off state of the switch 600 is determined in accordance with the third configuration data, and the switch 600 is on in the initial state. Further, the potentials of the nodes 603a and 603b are 0 in the initial state.

First, write of configuration data (time T1 to time T6) is described.

At the time T2, the wiring 606a is set "H", the wiring 617 is set "L", and the wiring 607 is "L". At this time, the potential of the node 603a becomes 0; this potential corresponds to a potential for turning off the switch 600. That is, this state corresponds to a state where the switch 600 stores "L" as the first configuration data. Note that the output of the programmable logic element 612 is "L".

At the time T3, the wiring 606a is set "L". At this time, the potential of the node 603a is 0.

At the time T5, the wirings 606b is set "H", the wiring 617 is set "L", and the wiring 607 is "H". At this time, the potential of the node 603b becomes +V; this potential corresponds to a potential for turning on the switch 600. That is, this state corresponds to a state where the switch 600 stores "H" as the second configuration data. Note that the output of the programmable logic element 612 is "L".

At the time T6, the wiring 606b is set "L". At this time, the potential of the node 603b is +V.

Note that it is preferable that write of configuration data be finished in a time as short as possible and as soon as possible after the time T1 and the time T4 each of which is the time of a positive edge of the clock signal input to the wiring 616. Specifically, it is preferable that write of configuration data be started after a hold time of the flip-flop passes from the time T1 and the time T4. With such a structure, configuration data can be rewritten without impairing the operation of the PLD.

Next, switching of configuration data (time T7 to time T10) is described.

At the time T8, the wiring 605a is set "H", and the wiring 605c is set "L". At this time, the potential of the node 603a is 0, and the potential of the node 603c is +V. Thus, the switch 600 is turned off, which means that switching to the first configuration data is completed.

At the time T10, the wiring 605a is set "L", and the wiring 605b is set "H". At this time, the potential of the node 603a is 0, and the potential of the node 603b is +V. Thus, the switch 600 is turned on, which means that switching to the second configuration data is completed.

Note that it is preferable that switching of configuration data be performed as soon as possible after the time T7 and the time T9 each of which is the time of a positive edge of the clock signal input to the wiring 616. Specifically, it is preferable that switching of configuration data be performed after a hold time of the flip-flop passes from the time T7 and the time T9. With such a structure, configuration data can be switched without impairing the operation of the PLD.

With the above-described structure, it is possible to provide a low power consumption PLD that achieves high-speed configuration capable of dynamic configuration and has a short startup time.

Figure 10:
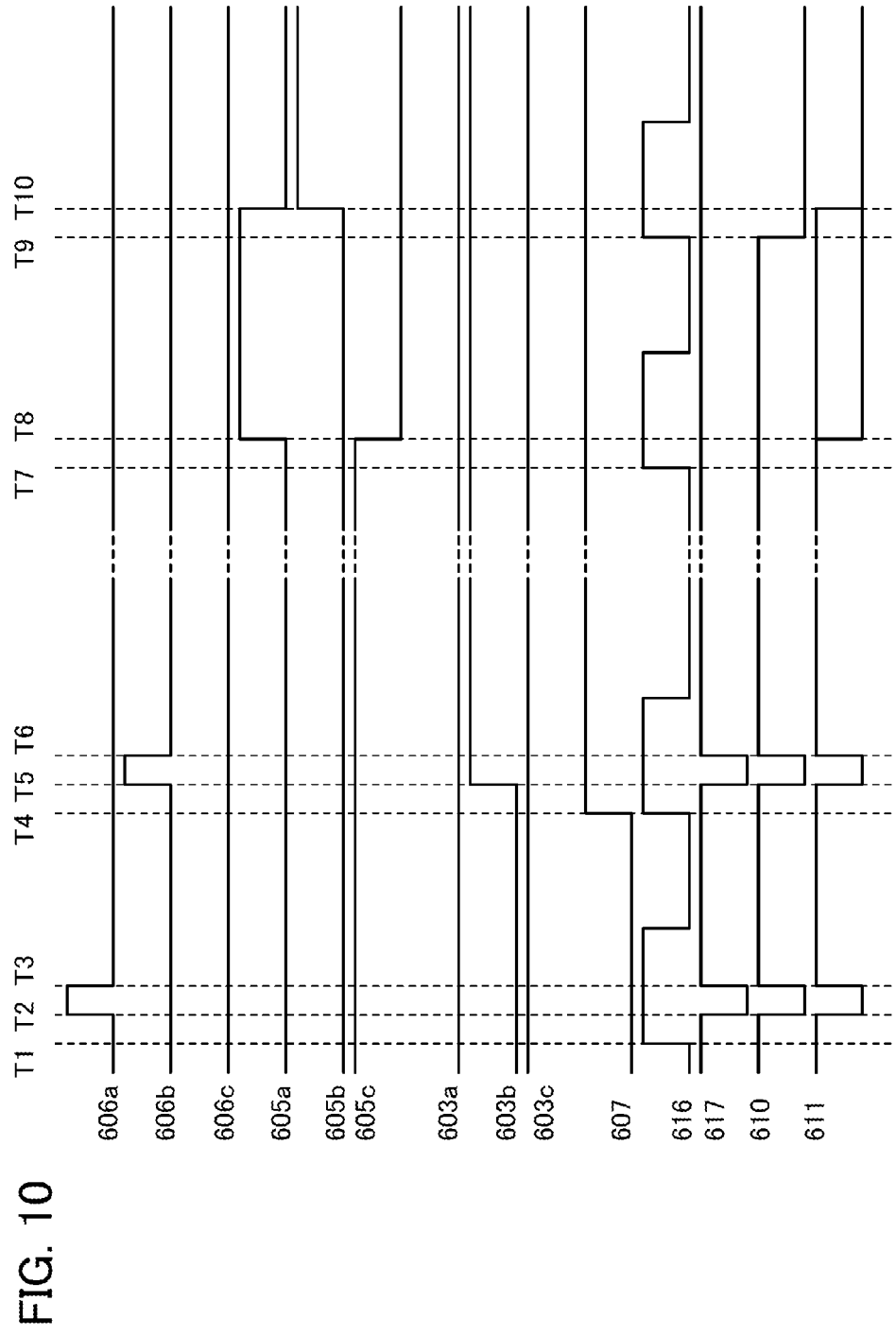
FIG. 10 is a timing chart illustrating one embodiment of a circuit operation.

Further, in the method of operating the switch 600 in FIG. 10, an enable signal 0 is input to the wiring 617 (the output of the programmable logic element 612 is 0) to write configuration data into the nodes 603a to 603c. However, configuration data can be written with the enable signal input to the wiring 617 remaining at 1 (without setting the output of the programmable logic element 612 at 0) when the gate capacitance of the second transistors 602a to 602c is sufficiently larger than the source-gate capacitance and drain-gate capacitance or when a storage capacitor is electrically connected to the gates of the second transistors 602a to 602c and the gate capacitance and storage capacitance are sufficiently larger than the source-gate capacitance and drain-gate capacitance.

This embodiment can be combined with any of the other embodiments as appropriate.

(Embodiment 6)

Figure 11:
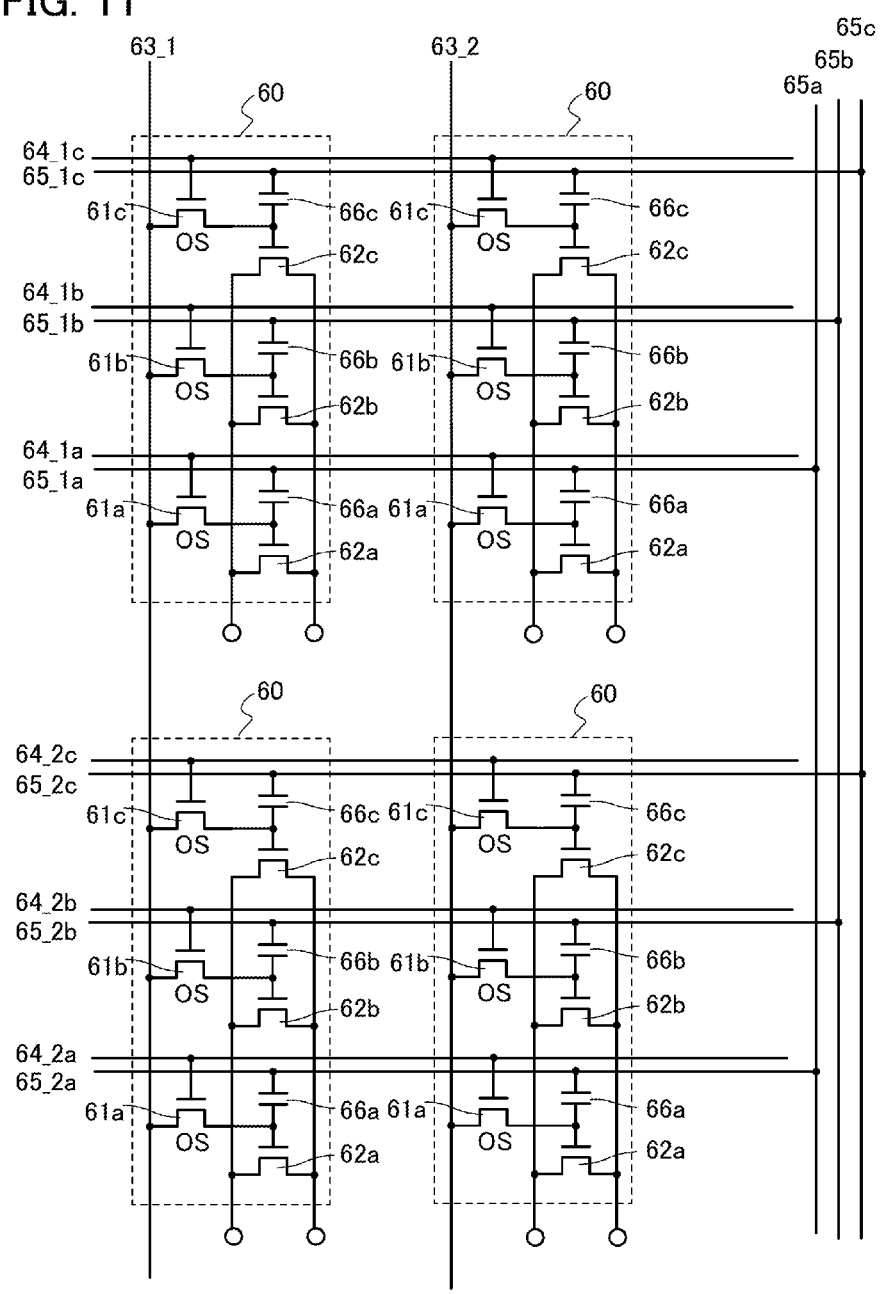
FIG. 11 is a circuit diagram illustrating one embodiment of a semiconductor device.

In Embodiment 6, an example of electrical connection between a plurality of switches in a logic array included in a PLD will be described with reference to FIG. 11.

As described in Embodiment 1, a logic array is configured with an arrangement of a plurality of programmable logic elements, wirings, and switches. The switches are arranged in a vertical direction and a lateral direction to form a matrix. FIG. 11 is a conceptual diagram showing only switches 60 in the logic array. The switch 60 includes first transistors 61a, 61b, and 61c, second transistors 62a, 62b, and 62c, and capacitors 66a, 66b, and 66c like the switch 200 described in Embodiment 1, for example.

Here, a wiring 63_1 electrically connected to sources of the first transistors 61a, 61b, and 61c in the switch 60 is a common wiring to the switches 60 arranged in the vertical direction. Similarly, a wiring 63_2 is shared by and electrically connected to the switches 60 arranged in the vertical direction.

On the other hand, wirings 64_1a, 64_1b, 64_1c, 64_2a, 64_2b, and 64_2c that are connected to gates of the first transistors 61a, 61b, and 61c in the switches 60 are shared by the switches 60 arranged in the lateral direction.

With the electrical connection between the switches in this embodiment, to write configuration data through the first transistors 61a, 61b, and 61c in each switch 60, the wirings 64_1c, 64_1b, 64_1a, 64_2c, 64_2b, and 64_2a are selected in this order to sequentially turn on the first transistors from the top row, and configuration data is written through the wirings 63_1 and 63_2.

Wirings 65_1a, 65_1b, 65_1c, 65_2a, 65_2b, and 65_2c that are electrically connected to one electrode of the capacitors 66a, 66b, and 66c are shared by the switches 60 in the lateral direction, and are also shared by the switches 60 in the vertical direction through wirings 65a, 65b, and 65c. Thus, since one electrode of the capacitor in each of the three groups included in the switch 60 is electrically connected to a corresponding one of the wirings 65a, 65b, and 65c, by selecting one of the wirings 65a, 65b, and 65c, configuration data stored in the groups which share the selected wiring can be read at a time.

Note that the above structure may be divided into blocks and operation such as data read and data write may be performed in each block.

This embodiment can be combined with any of the other embodiments as appropriate.

(Embodiment 7)

Embodiment 7 will explain examples of the structure of a lookup table (LUT) included in the programmable logic element of the foregoing embodiments. The LUT can be composed of a plurality of multiplexers. Configuration data can be input to any of input terminals and control terminals of the plurality of multiplexers.

Figure 13A:
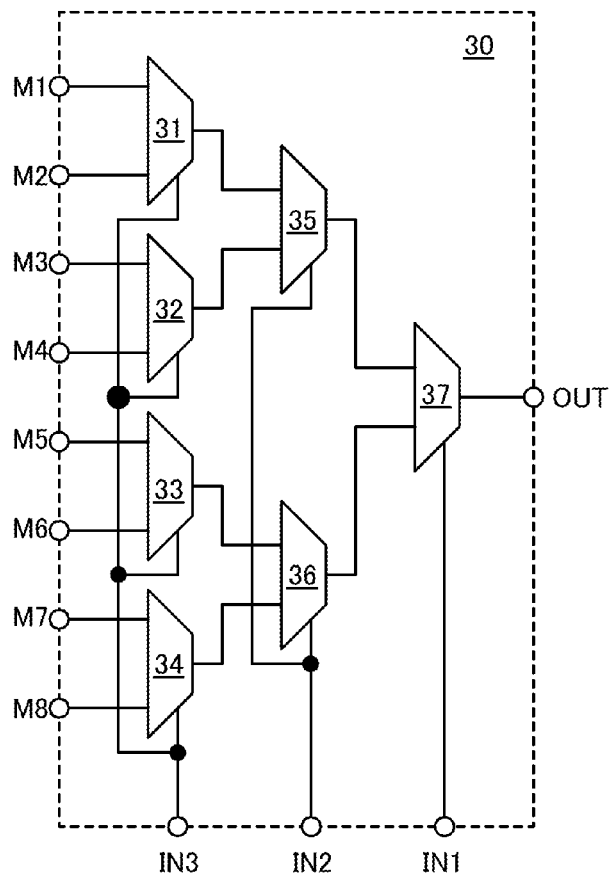
FIGS. 13A to 13C are circuit diagrams each illustrating one embodiment of a semiconductor device.

FIG. 13A illustrates one embodiment of a LUT 30 included in the programmable logic element.

In FIG. 13A, the LUT 30 is composed of seven two-input multiplexers (multiplexers 31 to 37). Input terminals of the multiplexers 31 to 34 correspond to input terminals M1 to M8 of the LUT 30.

Control terminals of the multiplexers 31 to 34 are electrically connected to each other and correspond to an input terminal IN3 of the LUT 30. Output terminals of the multiplexers 31 and 32 are electrically connected to two respective input terminals of the multiplexer 35. Output terminals of the multiplexers 33 and 34 are electrically connected to two respective input terminals of the multiplexer 36. Control terminals of the multiplexers 35 and 36 are electrically connected to each other and correspond to an input terminal IN2 of the LUT 30. Output terminals of the multiplexers 35 and 36 are electrically connected to two respective input terminals of the multiplexer 37. A control terminal of the multiplexer 37 corresponds to an input terminal IN1 of the LUT 30. An output terminal of the multiplexer 37 corresponds to an output terminal OUT of the LUT 30.

The kind of logic operation performed by the LUT 30 can be determined by input of configuration data from a configuration memory to the input terminals M1 to M8.

Figure 13B:
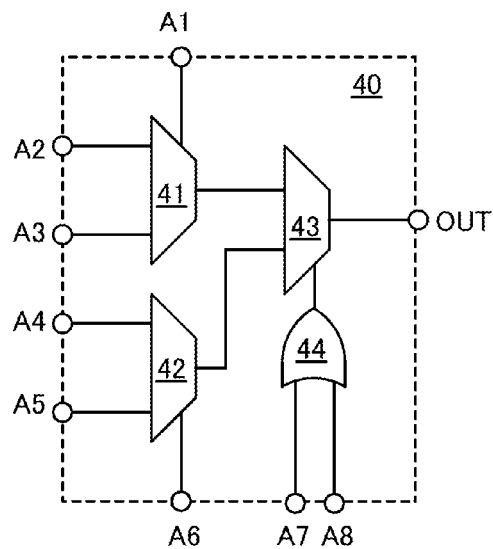
Figure 13C:

For example, when configuration data having digital values "0", "1", "0", "1", "0", "1", "1", and "1" are input to the input terminals M1 to M8 of the LUT 30 in FIG. 13A, the function of an equivalent circuit illustrated in FIG. 13C can be obtained.

FIG. 13B illustrates one embodiment of a LUT 40 included in the programmable logic element.

In FIG. 13B, the LUT 40 is composed of three two-input multiplexers (multiplexers 41 to 43) and a two-input OR circuit 44.

Output terminals of the multiplexers 41 and 42 are electrically connected to two respective input terminals of the multiplexer 43. An output terminal of the OR circuit 44 is electrically connected to a control terminal of the multiplexer 43. An output terminal of the multiplexer 43 corresponds to an output terminal OUT of the LUT 40.

The kind of logic operation performed by the LUT 40 can be determined when an output signal corresponding to configuration data stored in a configuration memory is input from the configuration memory to any of a control terminal A1 and input terminals A2 and A3 of the multiplexer 41, a control terminal A6 and input terminals A4 and A5 of the multiplexer 42, and input terminals A7 and A8 of the OR circuit 44.

For example, when output signals corresponding to configuration data that are stored in the configuration memory and have digital values "0", "1", "0", "0", and "0" are input from the configuration memory to the input terminal A2, the input terminal A4, the input terminal A5, the control terminal A6, and the input terminal A8 of the LUT 40 in FIG. 13B, the function of the equivalent circuit illustrated in FIG. 13C can be obtained. In the above structure, the control terminal A1, the input terminal A3, and the input terminal A7 correspond to the input terminal IN1, the input terminal IN2, and the input terminal IN3, respectively.

Note that FIGS. 13A and 13B illustrate examples of the LUTs 30 and 40 each of which is composed of two-input multiplexers; alternatively, the LUTs 30 and 40 may be composed of multiplexers with three or more inputs.

The LUT 30 or the LUT 40 may further include any or all of a diode, a resistor, a logic circuit (or a logic element), and a switch in addition to the multiplexers. As the logic circuit (or the logic element), a buffer, an inverter, a NAND circuit, a NOR circuit, a three-state buffer, a clocked inverter, or the like can be used. As the switch, an analog switch or a transistor can be used, for example.

The case illustrated in FIG. 13C in which three-input one-output logic operation is performed with the LUT 30 in FIG. 13A or the LUT 40 in FIG. 13B is described here; however, this embodiment is not limited thereto. By appropriately selecting the structure of the LUT 30 or the LUT 40 and configuration data to be input, logic operation with four or more inputs and two or more outputs can be performed.

This embodiment can be combined with any of the other embodiments as appropriate.

(Embodiment 8)

Figure 14:
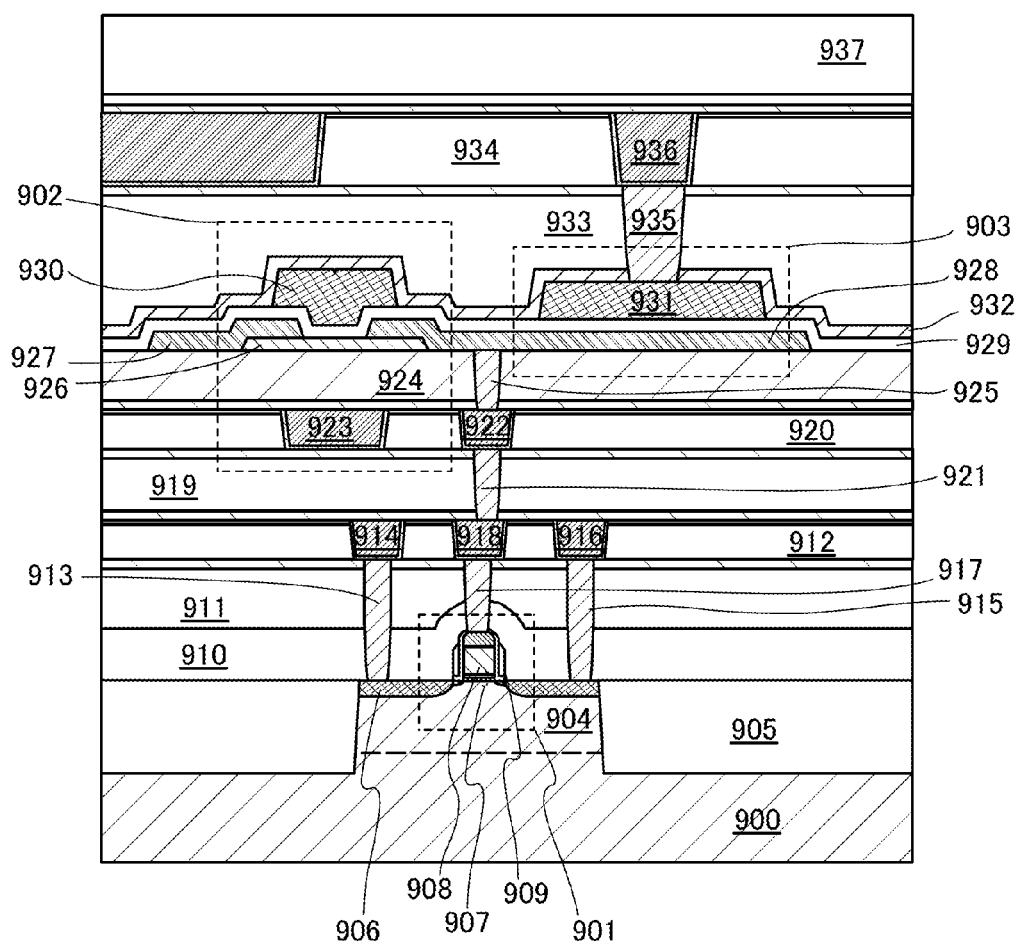
FIG. 14 is a cross-sectional view illustrating one embodiment of a semiconductor device.

Referring to FIG. 14, Embodiment 8 will explain an example of a cross-sectional structure and a fabrication method of the switch described in any of the above embodiments in which an oxide semiconductor is used for a channel formation region of a first transistor 902 and a single crystal silicon wafer is used for a channel formation region of a second transistor 901.

Note that a semiconductor material such as germanium, silicon germanium, or single crystal silicon carbide as well as silicon may be used for the second transistor 901 included in the switch. A transistor including silicon can be formed using a silicon thin film formed by an SOI method or a silicon thin film formed by vapor deposition, for example; in this case, a glass substrate formed by a fusion process or a float process, a quartz substrate, a semiconductor substrate, a ceramic substrate, or the like can be used as a substrate. In the case where a glass substrate is used and the temperature of heat treatment to be performed later is high, it is preferable to use a glass substrate with a strain point of 730° C. or higher FIG. 14 illustrates an embodiment of a cross-sectional structure showing the circuit structure of one group that stores one piece of configuration data in the switch. In this case, the second transistor 901 using a single crystal silicon wafer is formed, and the first transistor 902 using an oxide semiconductor and a capacitor 903 are formed above the second transistor 901. In other words, the switch described in this embodiment is a semiconductor device that has a three-dimensional layered structure in which a silicon wafer is used as a substrate and a first transistor layer is provided above the silicon wafer. Moreover, the switch in this embodiment is a hybrid semiconductor device including a transistor in which silicon is used for a channel formation region and a transistor in which an oxide semiconductor is used for a channel formation region.

Although only a cross section of the structure of part of the switch is shown in this embodiment, a programmable logic element or another circuit can be configured with this layered structure. Thus, the whole PLD can be integrated in this layered structure.

The second transistor 901 formed using a substrate 900 containing a semiconductor material can be either an n-channel transistor (nMOSFET) or a p-channel transistor (pMOSFET). In the example illustrated in FIG. 14, the second transistor 901 is electrically isolated from other elements by a shallow trench isolation (STI) 905. The use of the STI 905 can reduce generation of a bird's beak, which is caused by a LOCOS element isolation method, in an element isolation region and can reduce the size of the element isolation region. On the other hand, in a semiconductor device that is not required to be structurally miniaturized or downsized, the STI 905 is not necessarily formed and an element isolation means such as LOCOS can be used. In the substrate 900 where the second transistor 901 is formed, a well 904 to which an impurity imparting conductivity, such as boron, phosphorus, or arsenic, is added is formed.

The second transistor 901 in FIG. 14 includes a channel formation region in the substrate 900, impurity regions 906 (also referred to as a source region and a drain region) provided such that the channel formation region is placed therebetween, a gate insulating film 907 over the channel formation region, and a gate electrode layer 908 provided over the gate insulating film 907 to overlap the channel formation region. The gate electrode layer can have a stacked structure of a gate electrode layer including a first material for increasing processing accuracy and a gate electrode layer including a second material for decreasing the resistance as a wiring. For example, the gate electrode layer can have a stacked structure of crystalline silicon to which an impurity imparting conductivity, such as phosphorus, is added and nickel silicide. Note that the structure is not limited to this, and materials, the number of stacked layers, the shape, or the like can be adjusted as appropriate depending on required specifications.

Note that the second transistor 901 illustrated in FIG. 14 may be a fin-type transistor. In a fin-type structure, part of a semiconductor substrate is processed into a plate-shaped protrusion, and a gate electrode layer is provided to cross the protrusion in the longitudinal direction. The gate electrode layer covers an upper surface and side surfaces of the protrusion with a gate insulating film placed between the gate electrode layer and the protrusion. With the second transistor having a fin-type structure, the channel width can be reduced to achieve higher integration of transistors. Moreover, a larger amount of current can flow through the transistor and the control efficiency can be increased, so that the off-state current and threshold voltage of the transistor can be reduced.

Contact plugs 913 and 915 are connected to the impurity regions 906 in the substrate 900. Here, the contact plugs 913 and 915 also function as a source electrode and a drain electrode of the second transistor 901. In addition, impurity regions that are different from the impurity regions 906 are provided between the impurity regions 906 and the channel formation region. The impurity regions function as LDD regions or extension regions for controlling the distribution of electric fields in the vicinity of the channel formation region, depending on the concentration of an impurity introduced thereto. Sidewall insulating films 909 are provided at side surfaces of the gate electrode layer 908 with an insulating film placed therebetween. By using this insulating film and the sidewall insulating films 909, the LDD regions or extension regions can be formed.

The second transistor 901 is covered with an insulating film 910. The insulating film 910 can function as a protective film and can prevent impurities from entering the channel formation region from the outside. With the insulating film 910 formed by CVD using a material such as silicon nitride, hydrogenation can be performed by heat treatment in the case where single crystal silicon is used for the channel formation region. When an insulating film having tensile stress or compressive stress is used as the insulating film 910, distortion can be provided to the semiconductor material used for the channel formation region. By application of tensile stress to a silicon material used for the channel formation region of an n-channel transistor or application of compressive stress to a silicon material used for the channel formation region of a p-channel transistor, the field-effect mobility of the transistor can be increased.

An insulating film 911 is provided over the insulating film 910, and a surface of the insulating film 911 is planarized by CMP. Consequently, element layers can be stacked with high accuracy above a layer including the second transistor 901.

A layer including the capacitor 903 and the first transistor 902 in which an oxide semiconductor film is used for a channel formation region is formed above the layer including the second transistor 901. The first transistor 902 is a top-gate transistor. The first transistor 902 includes a source electrode layer 927 and a drain electrode layer 928 in contact with side surfaces and an upper surface of an oxide semiconductor film 926, and includes a gate electrode layer 930 over a gate insulating film 929 placed over the oxide semiconductor film 926, the source electrode layer 927, and the drain electrode layer 928. An insulating film 932 is formed to cover the first transistor 902. Here, a method of fabricating the first transistor 902 will be described below.

The oxide semiconductor film 926 is formed over the insulating film 924. The insulating film 924 can be formed using an inorganic insulating film of silicon oxide, silicon nitride, silicon nitride oxide, silicon oxynitride, aluminum oxide, aluminum nitride, aluminum nitride oxide, or the like. In particular, the insulating film 924 is preferably formed using a material with a low dielectric constant (a low-k material) because capacitance due to overlap of electrodes or wirings can be sufficiently reduced. Note that the insulating film 924 may be a porous insulating film containing any of the above materials. Since the porous insulating film has lower dielectric constant than a dense insulating film, parasitic capacitance due to electrodes or wirings can be further reduced. In this embodiment, the insulating film 924 is a stack of a silicon oxide film with a thickness of about 300 nm on a 50-nm-thick aluminum oxide film.

The oxide semiconductor film 926 can be formed by processing an oxide semiconductor film formed over the insulating film 924 into a desired shape. The thickness of the oxide semiconductor film is 2 nm to 200 nm, preferably 3 nm to 50 nm, more preferably 3 nm to 20 nm. The oxide semiconductor film is formed by sputtering using an oxide semiconductor target. Moreover, the oxide semiconductor film can be formed by sputtering under a rare gas (e.g., argon) atmosphere, an oxygen atmosphere, or a mixed atmosphere of a rare gas (e.g., argon) and oxygen.

Note that before the oxide semiconductor film is formed by sputtering, dust on a surface of the insulating film 924 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used.

As the oxide semiconductor, any of the following oxides can be used, for example: indium oxide, tin oxide, zinc oxide, two-component metal oxides such as In—Zn-based oxide, Sn—Zn-based oxide, Al—Zn-based oxide, Zn—Mg-based oxide, Sn—Mg-based oxide, In—Mg-based oxide, and In—Ga-based oxide; three-component metal oxides such as In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, and In—Lu—Zn-based oxide; and four-component oxides such as In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide. The oxide semiconductor may contain silicon.

In this embodiment, an In—Ga—Zn-based oxide semiconductor thin film that has a thickness of 30 nm and is obtained by sputtering using a target including indium (In), gallium (Ga), and zinc (Zn) is used as the oxide semiconductor film. As the target, it is preferable to use a target having an atomic ratio of In:Ga:Zn=1:1:1, 4:2:3, 3:1:2, 1:1:2, 2:1:3, or 3:1:4. The filling rate of the target including In, Ga, and Zn is 90% or higher and 100% or lower, and preferably 95% or higher and lower than 100%. With the use of the target with high filling rate, a dense oxide semiconductor film is formed.

In the case where an In—Zn-based material is used for the oxide semiconductor film, a target to be used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 in an atomic ratio ($In_2O_3$:ZnO=15:2 to 3:4 in a molar ratio). For example, in a target used for formation of an In—Zn-based oxide semiconductor with an atomic ratio of In:Zn:O=X:Y:Z, the relation of $Z>1.5X+Y$ is satisfied. The mobility can be improved by keeping the ratio of Zn within the above range.

In the case where an In—Sn—Zn-based oxide semiconductor film is formed as the oxide semiconductor film by sputtering, it is preferable to use an In—Sn—Zn—O target having an atomic ratio of In:Sn:Zn=1:1:1, 2:1:3, 1:2:2, or 20:45:35.

In this embodiment, the oxide semiconductor film is formed in such a manner that the substrate is held in a treatment chamber kept in a reduced pressure state, a sputtering gas from which hydrogen and moisture are removed is introduced while moisture remaining in the treatment chamber is removed, and the above-described target is used. The substrate temperature during the film formation may be 100° C. to 600° C., preferably 200° C. to 400° C. By forming the oxide semiconductor film while the substrate is heated, the concentration of impurities included in the formed oxide semiconductor film can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, for example, a hydrogen atom, a compound containing a hydrogen atom, such as water ($H_2O$), and the like are removed, whereby the impurity concentration in the oxide semiconductor film formed in the treatment chamber can be reduced.

As one example of the deposition conditions, the distance between the substrate and the target is 100 mm, the pressure is 0.6 Pa, the direct-current (DC) power is 0.5 kW, and the atmosphere is an oxygen atmosphere (the proportion of the oxygen flow rate is 100%). Note that a pulsed direct-current (DC) power source is preferably used because dust generated in deposition can be reduced and the film thickness can be made uniform.

When the leakage rate of the treatment chamber of the sputtering apparatus is set to $1\times10^{-10}$ Pa·m$^3$/s or less, entry of impurities such as an alkali metal or a hydride into the oxide semiconductor film that is formed by sputtering can be reduced. Further, with the use of an entrapment vacuum pump as an exhaustion system, counter flow of impurities such as an alkali metal, hydrogen atoms, hydrogen molecules, water, or a hydride from the exhaustion system can be reduced.

When the purity of the target is set to 99.99% or higher, an alkali metal, hydrogen atoms, hydrogen molecules, water, a hydroxyl group, a hydride, or the like mixed into the oxide semiconductor film can be reduced. In addition, when the above target is used, the concentration of an alkali metal such as lithium, sodium, or potassium can be reduced in the oxide semiconductor film.

In order that the oxide semiconductor film contains as little hydrogen, a hydroxyl group, and moisture as possible, it is preferable that impurities such as moisture or hydrogen that are adsorbed on the substrate 900 be desorbed and exhausted by preheating of the substrate 900 over which the insulating film 924 is formed in a preheating chamber of a sputtering apparatus, as pretreatment for deposition. The temperature for the preheating is 100° C. to 400° C., preferably 150° C. to 300° C. As an evacuation unit provided in the preheating chamber, a cryopump is preferably used. Note that this preheating treatment can be omitted.

Note that etching for forming the oxide semiconductor film 926 may be dry etching, wet etching, or both dry etching and wet etching. As an etching gas used for dry etching, it is preferable to use a gas containing chlorine (a chlorine-based gas such as chlorine ($Cl_2$), boron trichloride ($BCl_3$), silicon tetrachloride ($SiCl_4$), or carbon tetrachloride ($CCl_4$)). Alternatively, it is possible to use a gas containing fluorine (a fluorine-based gas such as carbon tetrafluoride (CFO, sulfur hexafluoride (SF), nitrogen trifluoride ($NF_3$), or trifluoromethane ($CHF_3$)), hydrogen bromide (Br), oxygen ($O_2$), any of these gases to which a rare gas such as helium (He) or argon (Ar) is added, or the like.

As the dry etching method, a parallel plate RIE (reactive ion etching) method or an ICP (inductively coupled plasma) etching method can be used. In order to etch the film into a desired shape, the etching conditions (e.g., the electric power applied to a coiled electrode, the electric power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by Kanto Chemical Co., Inc.) is used.

A resist mask used for forming the oxide semiconductor film 926 may be formed by an inkjet method. Formation of the resist mask by an inkjet method needs no photomask; thus, fabrication cost can be reduced.

Note that it is preferable that reverse sputtering is performed before the formation of a conductive film in a subsequent step so that a resist residue and the like that attach onto surfaces of the oxide semiconductor film 926 and the insulating film 924 are removed.

Note that the oxide semiconductor film formed by sputtering or the like sometimes contains a large amount of moisture or hydrogen (including a hydroxyl group) as impurities. Moisture or hydrogen easily forms donor levels and thus serves as impurities in the oxide semiconductor. Therefore, in one embodiment of the present invention, in order to reduce impurities such as moisture and hydrogen in the oxide semiconductor film (dehydrate or dehydrogenate the oxide semiconductor film), the oxide semiconductor film 926 is subjected to heat treatment in a reduced-pressure atmosphere, an inert gas atmosphere of nitrogen, a rare gas, or the like, an oxygen gas atmosphere, or an ultra-dry air atmosphere (with a moisture content of 20 ppm (−55° C. by conversion into a dew point) or less, preferably 1 ppm or less, further preferably 10 ppb or less, in the case where the measurement is performed by a dew point meter of a cavity ring down laser spectroscopy (CRDS) system).

By performing heat treatment on the oxide semiconductor film 926, moisture or hydrogen in the oxide semiconductor film 926 can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately 3 to 6 minutes. When RTA (rapid thermal annealing) is used for the heat treatment, dehydration or dehydrogenation can be performed in a short time; thus, treatment can be performed even at a temperature higher than the strain point of a glass substrate.

In this embodiment, an electric furnace which is one of heat treatment apparatuses is used.

Note that the heat treatment apparatus is not limited to an electric furnace, and may have a device for heating an object by heat conduction or heat radiation from a heating element such as a resistance heating element. For example, an RTA apparatus such as a GRTA (gas rapid thermal annealing) apparatus or an LRTA (lamp rapid thermal annealing) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object by heat treatment, like nitrogen or a rare gas such as argon is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably 6N (99.9999%) or higher, more preferably 7N (99.99999%) or higher (i.e., the impurity concentration is preferably 1 ppm or lower, more preferably 0.1 ppm or lower).

Through the above-described steps, the concentration of hydrogen in the oxide semiconductor film 926 can be reduced and the oxide semiconductor film 926 is highly purified. Thus, the oxide semiconductor film can be stable. In addition, by using the oxide semiconductor film in which the hydrogen concentration is reduced and the purity is improved, it is possible to fabricate a transistor with high withstand voltage and extremely low off-state current. The above heat treatment can be performed at any time after the oxide semiconductor film is formed.

Moreover, oxygen vacancies that serve as donors in the oxide semiconductor film 926 may be reduced by subjecting the oxide semiconductor film 926 to heat treatment in an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment in an oxygen atmosphere do not include water, hydrogen, or the like. Alternatively, the purity of the oxygen gas which is introduced into the heat treatment apparatus is preferably 6N (99.9999%) or higher, further preferably 7N (99.99999%) or higher (i.e., the impurity concentration in the oxygen gas is preferably 1 ppm or lower, further preferably 0.1 ppm or lower).

Alternatively, oxygen may be added to the oxide semiconductor film 926 by ion implantation, ion doping, or the like to reduce oxygen vacancies serving as donors. For example, oxygen that is made into a plasma state with a microwave at 2.45 GHz may be added to the oxide semiconductor film 926.

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of each crystal part fits inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC-film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depends on regions.

Note that when the CAAC-OS film with an $InGaZnO_4$ crystal is analyzed by an out-plane method, a peak of 2θ may also be observed at around 36°, in addition to the peak of 2θ at around 31°. The peak of 2θ at around 36° is derived from the (311) plane of a $ZnGa_2O_4$ crystal; such a peak indicates that a $ZnGa_2O_4$ crystal is included in part of the CAAC-OS film including the $InGaZnO_4$ crystal. It is preferable that in the CAAC-OS film, a peak of 2θ appear at around 31° and a peak of 2θ do not appear at around 36°.

In a transistor using the CAAC-OS film, change in electric characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

For example, the CAAC-OS film is formed by sputtering with a polycrystalline metal oxide target. By collision of ions with the target, a crystal region included in the target may be separated from the target along an a-b plane; in other words, sputtered particles having a plane parallel to an a-b plane (flat-plate-like sputtered particles or pellet-like sputtered particles) may flake off from the target. In this case, the flat-plate-like sputtered particles reach a substrate while maintaining their crystal state, whereby the CAAC-OS film can be formed.

The CAAC-OS film is preferably deposited under the following conditions.

Deformation of the crystal due to impurities can be prevented by reducing the amount of impurities entering the CAAC-OS film during the deposition, for example, by reducing the concentration of impurities (e.g., hydrogen, water, carbon dioxide, and nitrogen) that exist in the deposition chamber or by reducing the concentration of impurities in a deposition gas. Specifically, a deposition gas with a dew point of −80° C. or lower, preferably −100° C. or lower is used.

By increasing the substrate temperature during the deposition, migration of a sputtered particle is likely to occur after the sputtered particle reaches a substrate surface. Specifically, the substrate temperature during the deposition ranges from 100° C. to 740° C., preferably from 200° C. to 500° C. By increasing the substrate temperature during the deposition, when the flat-plate-like sputtered particle reaches the substrate, migration occurs on the substrate surface, so that a flat plane of the flat-plate-like sputtered particle is attached to the substrate.

It is preferable that the proportion of oxygen in the deposition gas be increased and the electric power be optimized in order to reduce plasma damage in the deposition. The proportion of oxygen in the deposition gas is 30 vol % or higher, preferably 100 vol %.

As an example of the sputtering target, an In—Ga—Zn-based oxide target will be described below.

A polycrystalline In—Ga—Zn-based oxide target is prepared by mixing $InO_X$ powder, $GaO_Y$ powder, and $ZnO_Z$ powder, applying pressure to the mixture, and then performing heat treatment on the mixture at temperatures ranging from 1000° C. to 1500° C. Note that X, Y, and Z are each a positive number. Here, the molar ratio of $InO_X$ to $GaO_Y$ and $ZnO_Z$ is, for example, 2:2:1, 8:4:3, 3:1:1, 1:1:1, 4:2:3, or 3:1:2. The morphology of powder and the molar ratio can be determined as appropriate depending on the desired target.

An alkali metal is not a constituent element of an oxide semiconductor and therefore is an impurity. An alkaline earth metal also serves as an impurity in the case where an alkaline earth metal is not a constituent element of an oxide semiconductor. Among the alkali metals, Na readily diffuses into an insulating film as an Na ion when an insulating film in contact with the oxide semiconductor film is an oxide. Further, in the oxide semiconductor film, Na cleaves a bond between metal and oxygen which are included in the oxide semiconductor or is inserted therebetween, causing deterioration of transistor characteristics (e.g., normally-on state of the transistor due to a negative shift of the threshold voltage or the decrease in mobility) and variations in the characteristics. Specifically, the Na concentration measured by secondary ion mass spectrometry is preferably $5\times10^{16}/cm^3$ or lower, further preferably $1\times10^{16}/cm^3$ or lower, still further preferably $1\times10^{15}/cm^3$ or lower. Similarly, the Li concentration is preferably $5\times10^{15}/cm^3$ or lower, further preferably $1\times10^{15}/cm^3$ or lower. Similarly, the K concentration is preferably $5\times10^{15}/cm^3$ or lower, further preferably $1\times10^{15}/cm^3$ or lower.

Next, the source electrode layer 927 and the drain electrode layer 928 are formed by a photolithography process. Specifically, the source electrode layer 927 and the drain electrode layer 928 can be formed in such a manner that a conductive film is formed over the insulating film 924 by sputtering or vacuum evaporation and then processed (patterned) into a predetermined shape.

The source electrode layer 927 and the drain electrode layer 928 may have a single-layer structure or a stacked structure of two or more layers and can be formed using an element selected from aluminum, chromium, copper, tantalum, titanium, molybdenum, and tungsten; an alloy containing any of these elements; or the like. Alternatively, the source electrode layer 927 and the drain electrode layer 928 may have a structure in which a film of a refractory metal such as chromium, tantalum, titanium, molybdenum, neodymium, scandium, yttrium, or tungsten is stacked over or below a metal film of aluminum, copper, or the like. Aluminum and copper are preferably used in combination with a refractory metal material in order to avoid problems caused by poor heat resistance and high corrosion.

For example, the source electrode layer 927 and the drain electrode layer 928 may have a single-layer structure of an aluminum film containing silicon, a two-layer structure in which a titanium film is stacked over an aluminum film, or a three-layer structure in which a titanium film, an aluminum film, and a titanium film are stacked in this order. A Cu—Mg—Al alloy, a Mo—Ti alloy, Ti, and Mo have high adhesiveness with an oxide film; therefore, when the source electrode layer 927 and the drain electrode layer 928 have a stacked structure in which a conductive film of Cu is stacked over a conductive film of a Cu—Mg—Al alloy, a Mo—Ti alloy, Ti, or Mo, the adhesion between the insulating film 924 and the source and drain electrode layers 927 and 928 can be increased.

For the source electrode layer 927 and the drain electrode layer 928, a conductive metal oxide may be used. As the conductive metal oxide, indium oxide, tin oxide, zinc oxide, a mixture of indium oxide and tin oxide, a mixture of indium oxide and zinc oxide, or the conductive metal oxide material containing silicon or silicon oxide can be used.

In the case where heat treatment is performed after the formation of the conductive film, the conductive film preferably has heat resistance high enough to withstand the heat treatment.

In this embodiment, a 100-nm-thick tungsten film is used for the source electrode layer 927 and the drain electrode layer 928.

Note that the materials and etching conditions are adjusted as appropriate so that the oxide semiconductor film 926 is not removed as much as possible in etching of the conductive film. Depending on the etching conditions, an exposed portion of the oxide semiconductor film 926 is partially etched and thus a groove (a recessed portion) is formed in some cases.

In this embodiment, a tungsten film is used as the conductive film to be the source electrode layer 927 and the drain electrode layer 928. Thus, wet etching can be selectively performed on the conductive film using a solution containing ammonia and hydrogen peroxide water (an ammonia hydrogen peroxide mixture). As the ammonia hydrogen peroxide mixture, a solution in which 31 wt % hydrogen peroxide water, 28 wt % ammonia water, and water are mixed at a volume ratio of 5:2:2 is specifically used. Alternatively, dry etching may be performed on the conductive film with the use of a gas containing carbon tetrafluoride ($CF_4$), chlorine ($Cl_2$), or oxygen.

In order to reduce the number of photomasks and steps in a photolithography process, etching may be performed with the use of a resist mask formed using a multi-tone mask which is a light-exposure mask through which light is transmitted so as to have a plurality of intensities. A resist mask formed using a multi-tone mask has a plurality of thicknesses and can be changed in shape by etching; thus, the resist mask can be used in a plurality of etching steps for processing films into different patterns. Thus, a resist mask corresponding to at least two kinds of different patterns can be formed by one multi-tone mask. As a result, the number of light-exposure masks can be reduced and the number of corresponding photolithography processes can also be reduced, whereby the fabrication process can be simplified.

Further, oxide conductive films functioning as a source region and a drain region may be provided between the oxide semiconductor film 926 and the source and drain electrode layers 927 and 928. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive films are formed, etching for forming the oxide conductive films and etching for forming the source electrode layer 927 and the drain electrode layer 928 may be performed concurrently.

By providing the oxide conductive films functioning as the source and drain regions, the resistance between the oxide semiconductor film 926 and the source and drain electrode layers 927 and 928 can be lowered, so that the transistor can operate at high speed. In addition, with provision of the oxide conductive films functioning as the source and drain regions, the withstand voltage of the transistor can be increased.

Next, plasma treatment may be performed using a gas such as $N_2O$, $N_2$, or Ar. By this plasma treatment, water or the like attached onto an exposed surface of the oxide semiconductor film is removed. Plasma treatment may be performed using a mixture gas of oxygen and argon as well.

After the plasma treatment, the gate insulating film 929 is formed to cover the source and drain electrode layers 927 and 928 and the oxide semiconductor film 926. Then, over the gate insulating film 929, the gate electrode layer 930 is formed to overlap the oxide semiconductor film 926 and a conductive film to be an upper electrode layer 931 of the capacitor is formed.

The gate insulating film 929 can be formed using a silicon oxynitride film, for example. Note that the gate insulating film 929 preferably includes impurities such as moisture or hydrogen as little as possible, and the gate insulating film 929 may be a single-layer insulating film or a plurality of insulating films stacked. If hydrogen is contained in the gate insulating film 929, hydrogen enters the oxide semiconductor film 926 or oxygen in the oxide semiconductor film 926 is extracted by hydrogen, whereby the oxide semiconductor film 926 has lower resistance (n-type conductivity) and a parasitic channel might be formed as a result. Thus, it is important that a deposition method in which hydrogen is not used be employed in order to form the gate insulating film 929 containing hydrogen as little as possible. A material having a high barrier property is preferably used for the gate insulating film 929. As the insulating film having a high barrier property, a silicon nitride film, a silicon nitride oxide film, an aluminum nitride film, or an aluminum nitride oxide film can be used, for example. When a plurality of insulating films stacked are used, an insulating film having a lower proportion of nitrogen, such as a silicon oxide film or a silicon oxynitride film, is formed closer to the oxide semiconductor film 926 than the insulating film having a high barrier property. Then, the insulating film having a high barrier property is formed to overlap the source and drain electrode layers 927 and 928 and the oxide semiconductor film 926 with the insulating film having a lower proportion of nitrogen placed therebetween. With the use of the insulating film having a high barrier property, impurities such as moisture and hydrogen can be prevented from entering the oxide semiconductor film 926, the gate insulating film 929, or the interface between the oxide semiconductor film 926 and another insulating film and the vicinity thereof. In addition, the insulating film having a lower proportion of nitrogen, such as a silicon oxide film or a silicon oxynitride film, formed in contact with the oxide semiconductor film 926 can prevent the insulating film having a high barrier property from being in direct contact with the oxide semiconductor film 926.

In this embodiment, a 20-nm-thick silicon oxynitride film formed by sputtering is used as the gate insulating film 929. The substrate temperature during the film formation may range from room temperature to 400° C. and is 300° C. in this embodiment.

After the gate insulating film 929 is formed, heat treatment may be performed. The heat treatment is performed in a nitrogen atmosphere, ultra-dry air, or a rare gas (e.g., argon or helium) atmosphere preferably at 200° C. to 400° C., and for example at 250° C. to 350° C. It is preferable that the water content in the gas be 20 ppm or less, preferably 1 ppm or less, further preferably 10 ppb or less. In this embodiment, for example, heat treatment is performed at 250° C. for 1 hour in a nitrogen atmosphere. Even when oxygen vacancies are generated in the oxide semiconductor film 926 by the previous heat treatment performed on the oxide semiconductor film 926, oxygen is supplied to the oxide semiconductor film 926 from the gate insulating film 929 by performing heat treatment after the gate insulating film 929 containing oxygen is provided. By the supply of oxygen to the oxide semiconductor film 926, oxygen vacancies that serve as donors can be reduced in the oxide semiconductor film 926 and the stoichiometric composition can be recovered. As a result, the oxide semiconductor film 926 can be made to be substantially i-type and variation in electrical characteristics of the transistor due to oxygen vacancies can be reduced; thus, electrical characteristics can be improved. There is no particular limitation on the timing of this heat treatment as long as it is after the formation of the gate insulating film 929. When this heat treatment doubles as another step, the oxide semiconductor film 926 can be made to be substantially i-type without increase in the number of steps.

The gate electrode layer 930 and the upper electrode layer 931 can be formed in such a manner that a conductive film is formed over the gate insulating film 929 and then is patterned.

The thickness of each of the gate electrode layer 930 and the upper electrode layer 931 is 10 nm to 400 nm, preferably 100 nm to 300 nm. In this embodiment, the gate electrode layer 930 and the upper electrode layer 931 are formed in the following manner: a 135-nm-thick tungsten film is stacked over a 30-nm-thick tantalum nitride film by sputtering to form a conductive film for the gate electrode, and then, the conductive film is processed (patterned) into a desired shape by etching. Note that a resist mask may be formed by an inkjet method. Formation of the resist mask by an inkjet method needs no photomask; thus, fabrication cost can be reduced.

Through the above steps, the first transistor 902 is formed.

Note that the first transistor 902 is described as a single-gate transistor; if necessary, it is possible to fabricate a multi-gate transistor that includes a plurality of gate electrodes electrically connected to each other and thus includes a plurality of channel formation regions.

In the fabrication method described above, the source electrode layer 927 and the drain electrode layer 928 are formed after the oxide semiconductor film 926. Accordingly, as illustrated in FIG. 14, the source electrode layer 927 and the drain electrode layer 928 are formed over the oxide semiconductor film 926. Alternatively, the source and drain electrode layers 927 and 928 may be formed below the oxide semiconductor film 926, that is, between the oxide semiconductor film 926 and the insulating film 924.

Note that insulating films in contact with the oxide semiconductor film 926, that is, the insulating film 924 and the gate insulating film 929 may be formed using an insulating material containing an element that belongs to Group 13 and oxygen. Many of oxide semiconductor materials contain a Group 13 element, and an insulating material containing a Group 13 element is compatible with such an oxide semiconductor. Thus, when an insulating material containing a Group 13 element is used for the insulating film in contact with the oxide semiconductor film, the state of the interface between the oxide semiconductor film and the insulating film can be kept favorable.

Examples of the insulating material containing a Group 13 element are gallium oxide, aluminum oxide, aluminum gallium oxide, and gallium aluminum oxide. Here, aluminum gallium oxide refers to a material in which the aluminum content is higher than the gallium content in atomic percent, and gallium aluminum oxide refers to a material in which the gallium content is higher than or equal to the aluminum content in atomic percent.

For example, an insulating film containing gallium oxide is formed so as to be in contact with an oxide semiconductor film containing gallium, by which pile up of hydrogen at the interface between the oxide semiconductor film and the insulating film can be reduced. Alternatively, it is effective to form an insulating film with the use of a material containing aluminum oxide. Note that water is less likely to permeate aluminum oxide, and it is therefore preferable to use a material containing aluminum oxide in order to prevent entry of water to the oxide semiconductor film.

It is preferable to add oxygen to not only the surface but also the inside of the insulating film which is in contact with the oxide semiconductor film 926 by heat treatment in an oxygen atmosphere, oxygen doping, or the like, resulting in a state in which oxygen is included in a proportion higher than the stoichiometric composition. Here, the term "oxygen doping" includes oxygen plasma doping in which oxygen that is made to be plasma is added to a bulk. The oxygen doping may be performed by ion implantation or ion doping.

By oxygen doping, an insulating film that includes a region where the proportion of oxygen is higher than that in the stoichiometric composition can be formed. When the insulating film including such a region is in contact with the oxide semiconductor film, excess oxygen in the insulating film is supplied to the oxide semiconductor film, and oxygen defects in the oxide semiconductor film or at the interface between the oxide semiconductor film and the insulating film are reduced. Thus, the oxide semiconductor film can be made to be an i-type or substantially i-type oxide semiconductor.

Note that the insulating film including a region where the proportion of oxygen is higher than that in the stoichiometric composition may be used as either the insulating film placed above the oxide semiconductor film 926 or the insulating film placed below the oxide semiconductor film 926 of the insulating films in contact with the oxide semiconductor film 926; however, it is preferable to use such an insulating film as both of the insulating films in contact with the oxide semiconductor film 926. The above-described effect can be enhanced with a structure where the insulating films including a region where the proportion of oxygen is higher than that in the stoichiometric composition are used as insulating films placed above and below the insulating films in contact with the oxide semiconductor film 926 so that the oxide semiconductor film 926 is sandwiched between the insulating films.

The insulating films placed above and below the oxide semiconductor film 926 may contain the same constituent elements or different constituent elements. The insulating film in contact with the oxide semiconductor film 926 may be a stack of insulating films each including a region where the proportion of oxygen is higher than that in the stoichiometric composition.

Note that in this embodiment, the first transistor 902 has a top-gate structure. The first transistor 902 includes a backgate electrode layer 923. The provision of the backgate electrode layer allows the first transistor 902 to more easily obtain normally-off characteristics. For example, when the potential of the backgate electrode layer 923 is set at GND or a fixed potential, the threshold voltage of the first transistor 902 can shift further in a positive direction, which leads to the formation of a normally-off transistor.

In order to electrically connect the second transistor 901, the first transistor 902, and the capacitor 903 to form an electric circuit, one or more wiring layers for connecting these elements are stacked between layers and on the upper layer.

In FIG. 14, to form the group in the switch in FIG. 3, for example, one of the source and the drain of the second transistor 901 is electrically connected to a wiring layer 914 through the contact plug 913. The wiring layer 914 is electrically connected to an output terminal of a programmable logic element. The other of the source and the drain of the second transistor 901 is electrically connected to a wiring layer 916 through the contact plug 915. The wiring layer 916 is electrically connected to an input terminal of another programmable logic element. The gate of the second transistor 901 is electrically connected to the drain electrode layer 928 of the first transistor 902 through a contact plug 917, a wiring layer 918, a contact plug 921, a wiring layer 922, and a contact plug 925. The drain electrode layer 928 is extended to the right in FIG. 14 and functions as a lower electrode layer of the capacitor 903. The gate insulating film 929 of the first transistor 902 is provided over the drain electrode layer 928. In a region where the capacitor 903 is formed, the gate insulating film 929 functions as an interelectrode dielectric film of the capacitor 903. The upper electrode layer 931 is provided over the interelectrode dielectric film and electrically connected to a wiring layer 936 through a contact plug 935. The wiring layer 936 is a wiring for selecting a group that stores one piece of configuration data in a switch.

The wiring layers 914, 916, 918, 922, and 936 and the backgate electrode layer 923 are embedded in insulating films. These wiring layers and the like are preferably formed using a low-resistance conductive material such as copper or aluminum. Alternatively, the wiring layers can be formed using graphene formed by CVD as a conductive material. Graphene is a one-atom thick sheet of $sp^2$-bonded carbon molecules or a stack of 2 to 100 sheets of the carbon molecules. Examples of a method of manufacturing such graphene are thermal CVD by which graphene is formed on a metal catalyst; and plasma CVD by which graphene is formed from methane, without using a catalyst, by plasma generated locally with ultraviolet light irradiation.

By using such a low-resistance conductive material, RC delay of signals transmitted through the wiring layers can be reduced. When copper is used for the wiring layers, a barrier film is formed in order to prevent copper from diffusing into the channel formation region. The barrier film can be a tantalum nitride film, a stack of a tantalum nitride film and a tantalum film, a titanium nitride film, or a stack of a titanium nitride film and a titanium film, for example, but is not limited to a film containing such materials as long as the film has a function of preventing diffusion of a wiring material and has adhesion to the wiring material, an insulating film, or the like. The barrier film may be formed as a layer that is independently formed, or may be formed in such a manner that a material of the barrier film is included in a wiring material and precipitated by heat treatment on the inner wall of an opening provided in an insulating film.

The insulating films 911, 912, 919, 920, 933, and 934 can be formed using an insulator such as silicon oxide, silicon oxynitride, silicon nitride oxide, borophosphosilicate glass (BPSG), phosphosilicate glass (PSG), silicon oxide to which carbon is added (SiOC), silicon oxide to which fluorine is added (SiOF), tetraethylorthosilicate (TEOS) which is silicon oxide prepared from $Si(OC_2H_5)_4$, hydrogen silsesquioxane (HSQ), methyl silsesquioxane (MSQ), organosilicate glass (OSG), or an organic polymer-based material. In the case of advancing miniaturization of a semiconductor device, parasitic capacitance between wirings is significant and signal delay is increased; therefore, the relative permittivity of silicon oxide (k=4.0 to 4.5) is too high, and a material with k=3.0 or less is preferably used. In addition, since CMP treatment is performed after the wirings are embedded in the insulating films, the insulating films need to have high mechanical strength. The insulating films can be made porous to have a lower dielectric constant as long as their mechanical strength can be secured. The insulating films are formed by sputtering, CVD, a coating method including spin coating (also referred to as spin on glass (SOG)), or the like.

An insulating film functioning as an etching stopper for planarization treatment by CMP or the like that is performed after the wiring material is embedded in the insulating films 911, 912, 919, 920, 933, and 934 may be additionally provided.

Barrier films are provided over the wiring layers 914, 916, 918, 922, and 936 and the backgate electrode layer 923, and a protective film is provided over each barrier film. The barrier film is provided in order to prevent diffusion of the wiring material such as copper. The barrier film can be formed using an insulating material such as silicon nitride, SiC, or SiBON. Note that a thick barrier film increases capacitance between wirings; therefore, a material having a barrier property and a low dielectric constant is preferably used.

Each of the contact plugs 913, 915, 917, 921, 925, and 935 is formed in such a manner that an opening (a via hole) with a high aspect ratio is formed in the insulating film and is filled with a conductive material such as tungsten. The opening is formed preferably by highly anisotropic dry etching and particularly preferably by reactive ion etching (RIE). The inner wall of the opening is covered with a barrier film (diffusion prevention film) formed of a titanium film, a titanium nitride film, a stack of such films, or the like, and a material such as tungsten or polysilicon doped with phosphorus or the like fills the opening. For example, tungsten is embedded in the via hole by blanket CVD, and an upper surface of the contact plug is planarized by CMP.

A protective insulating film 937 is provided in the top layer and prevents moisture and contaminant from entering a semiconductor device from the outside. The protective insulating film 937 can have a single-layer structure or a stacked structure using a material such as silicon nitride, silicon oxynitride, or silicon nitride oxide.

With the above-described structure in which a transistor that includes a first semiconductor material and is capable of operating at high speed is used in combination with a transistor that includes a second semiconductor material and has significantly low off-state current, it is possible to fabricate a semiconductor device such as a PLD that includes a logic circuit capable of operating at high speed with low power.

This embodiment can be combined with any of the other embodiments as appropriate.

(Embodiment 9)

The semiconductor device or the PLD in one embodiment of the present invention can be used for electronic devices in a wide variety of fields, such as digital signal processing devices, software-defined radio devices, avionic devices (electronic devices used in aircraft, such as communication systems, navigation systems, autopilot systems, and flight management systems), medical image processing devices, voice recognition devices, encryption devices, emulators for mechanical systems, and radio telescopes in radio astronomy. Application in ASIC prototyping in addition to the application in the field of bioinformatics is also possible.

Examples of consumer products are display devices, personal computers, and image reproducing devices provided with recording media (devices that reproduce the content of recording media such as digital versatile discs (DVDs) and have displays for displaying the reproduced images). Other examples are mobile phones, game consoles including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, and multifunction printers. FIGS. 15A to 15F illustrate specific examples of these electronic devices.

Figure 15A:
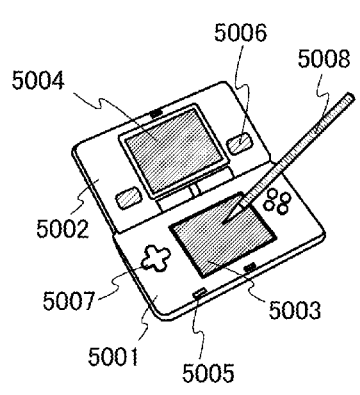
FIGS. 15A to 15F each illustrate an electronic device.

FIG. 15A illustrates a portable game console including a housing 5001, a housing 5002, a display portion 5003, a display portion 5004, a microphone 5005, a speaker 5006, an operation key 5007, a stylus 5008, and the like. Note that although the portable game console illustrated in FIG. 15A has the two display portions 5003 and 5004, the number of display portions is not limited to two.

Figure 15B:
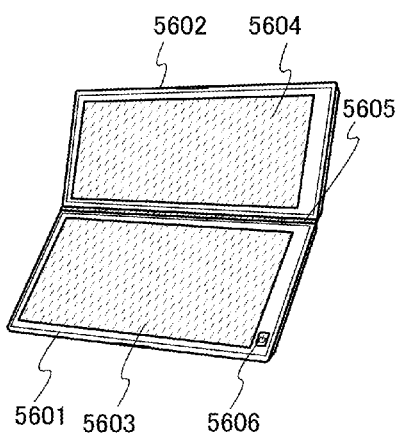

FIG. 15B illustrates a portable information terminal including a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images on the first display portion 5603 may be switched in accordance with the angle between the first housing 5601 and the second housing 5602. A display device with a position input function may be used as at least one of the first display portion 5603 and the second display portion 5604. Note that the position input function can be added by provision of a touch panel in a display device. Alternatively, the position input function can be added by provision of a photoelectric conversion element called a photosensor in a pixel area of a display device.

Figure 15C:
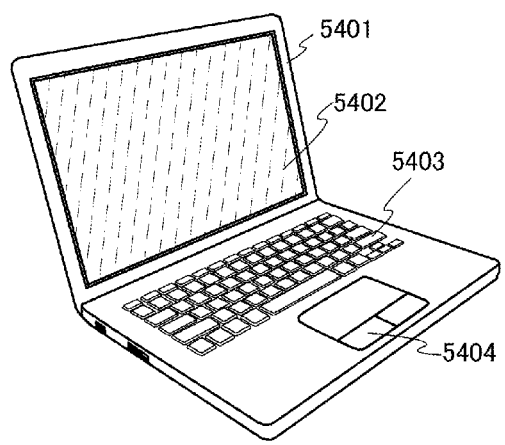

FIG. 15C illustrates a laptop including a housing 5401, a display portion 5402, a keyboard 5403, a pointing device 5404, and the like.

Figure 15D:
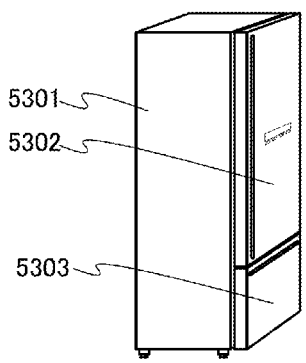

FIG. 15D illustrates an electric refrigerator-freezer including a housing 5301, a refrigerator door 5302, a freezer door 5303, and the like.

Figure 15E:
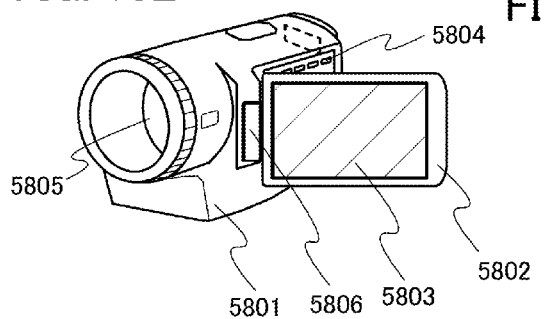

FIG. 15E illustrates a video camera including a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle between the first housing 5801 and the second housing 5802.

Figure 15F:
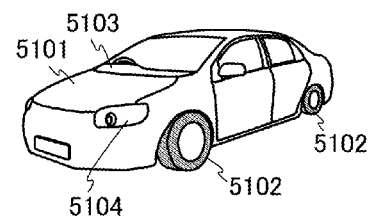

FIG. 15F illustrates a passenger car including a car body 5101, wheels 5102, a dashboard 5103, lights 5104, and the like.

This embodiment can be combined with any of the other embodiments as appropriate.

(Embodiment 10)

Next, the description is made on differences in operation between a switch that includes a transistor using an oxide semiconductor (OS) film and a switch that includes a transistor using a silicon (Si) film and a pair of inverters.

FIG. 16 illustrates circuit diagrams of a group 720a including a transistor using an OS film and a group 720b including transistors using a silicon (Si) film and a pair of inverters. FIG. 16 also shows timing charts of the potential of a node FD in the groups 720a and 720b and the potential of a signal IN that includes configuration data and is supplied to a wiring 721.

In each of the groups 720a and 720b, the on/off state of a transistor 701 is controlled with the potential of a wiring 722, and a potential that corresponds to configuration data and is supplied from the wiring 721 is held at the node FD to control the on/off state of a transistor 702. Note that the timing charts in FIG. 16 show an example where the transistor 702 is an re-channel transistor.

In the group 720b, the potential of the node FD is held by inverters 780 and 781. On the other hand, in the group 720a, the potential of the node FD is held using extremely low off-state current of the transistor 701 including an OS film. Accordingly, when the transistor 701 is off in the group 720a, the node FD serves as a floating electrode with excellent insulating property between other electrodes or wirings. For this reason, the group 720a can hold the potential of the node FD with a smaller number of transistors than the group 720b.

Since the node FD becomes floating in the group 720a, the boosting effect described below can be expected. Specifically, when the node FD is floating in the group 720a, the potential of the node FD is increased by various capacitances of the transistor 702 as the potential of the signal IN changes from low level to high level. When configuration data written into the group 720a is "0", the transistor 702 is in a weak inversion mode, so that a capacitance Cgs generated between the source and the gate contributes to an increase in the potential of the node FD. On the other hand, when configuration data written into the group 720a is "1", the transistor 702 is in a strong inversion mode, so that a capacitance Cox generated between a channel formation region and the gate as well as the capacitance Cgs contributes to an increase in the potential of the node FD. Thus, the capacitance of the transistor 702 that contributes to an increase in the potential of the node FD is larger with the configuration data "1" than with the configuration data "0". Consequently, the group 720a obtains a boosting effect such that the potential of the node FD is further increased with a change in the potential of the signal IN in the case where the configuration data is "1" as compared to the case where the configuration data is "0". With the boosting effect, the switching speed of the group 720a increases when the configuration data is "1", and the transistor 702 is turned off when the configuration data is "0".

In a switch included in a routing resource of a general PLD, an n-channel transistor is used in order to increase integration density. The switch, however, has a problem of reduction in switching speed because the potential of a signal passing through a gate of the n-channel transistor is lowered due to the threshold voltage. There has been suggested a method in which overdriving (driving with high potential application to a gate of an n-channel transistor) is used to increase the switching speed; however, employing this method might degrade the reliability of the n-channel transistor used in the switch. In contrast, in one embodiment of the present invention, when the configuration data is "1", the boosting effect can increase the switching speed of the group 720a without using overdriving; consequently, it is not necessary to sacrifice the reliability to increase the switching speed.

In the group 720b, the potential of the node FD is increased with the boosting effect but returned to the previous potential immediately by the inverters 780 and 781. As a result, the group 720b cannot gain the benefit of higher switching speed contributed by the boosting effect.

Unlike in Reference 1 (K. C. Chun, P. Jain, J. H. Lee, and C. H. Kim, "A 3T Gain Cell Embedded DRAM Utilizing Preferential Boosting for High Density and Low Power On-Die Caches", IEEE Journal of Solid-State Circuits, vol. 46, no. 6, pp. 1495-1505, June 2011) and Reference 2 (F. Eslami and M. Sima, "Capacitive Boosting for FPGA Interconnection Networks", Int. Conf. on Field Programmable Logic and Applications, 2011, pp. 453-458), the group 720a is expected to have another advantageous effect.

Since the circuit structure of Reference 1 is proposed with the purpose of improving data retention time and read speed of a DRAM, the number of memory cells is large, and a read bit line (RBL) connected to an output of the memory cell has large parasitic capacitance. In contrast, in the group 720a, a signal OUT is supplied to a gate of a CMOS, so that the parasitic capacitance of the output of the group 720a is smaller than that in Reference 1. Thus, the group 720a also provides a secondary boosting effect that the potential of the signal OUT is increased by a capacitance Cgd generated between the drain and the gate and an increase in the potential of the node FD due to the capacitance Cgs of the transistor 702. In other words, when the group 720a is used as a switch circuit for controlling connection between wirings, the switching speed is further increased because of the secondary boosting effect. In addition, the group 720a can hold the increased potential of the node FD with fewer transistors than in Reference 2.

To verify the above-described boosting effect, two kinds of 101-stage ring oscillator (RO) circuit TEGs that include the group 720a or the group 720b at an output of each stage were fabricated, and the delay time of the group 720a or the group 720b was evaluated from the oscillation frequency. The channel widths W of an n-channel transistor and a p-channel transistor of an inverter included in the RO circuit TEG were 16 μm and 32 μm, respectively. The channel widths W of the transistors 702 included in the groups 720a and 720b were 16 μm. The channel width W of the transistor 701 included in the group 720a was 4 μm, and that of the transistor 701 included in the group 720b was 8 μm. The channel widths W of an re-channel transistor and a p-channel transistor included in the inverters 780 and 781 in the group 720b were 4 μm and 8 μm, respectively. The channel lengths L of all the n-channel and p-channel transistors including a silicon film were 0.5 μm. As the transistor 701 in the group 720a, a transistor which includes a CAAC-OS film containing an In—Ga—Zn-based oxide and has a channel length L of 1 μm was used. The transistor 701 was stacked over the transistor including a silicon film.

The delay time per stage of the RO with respect to an overdrive voltage that is a difference between a power supply voltage ($VDD_{RO}$) in the RO circuit TEG and a power supply voltage ($VDD_{MEM}$) in the inverters 780 and 781 of the group 720b was measured. Note that the difference between a high-level potential and a low-level potential supplied to the wirings 721 and 722 corresponds to $VDD_{MEM}$.

Figure 17:
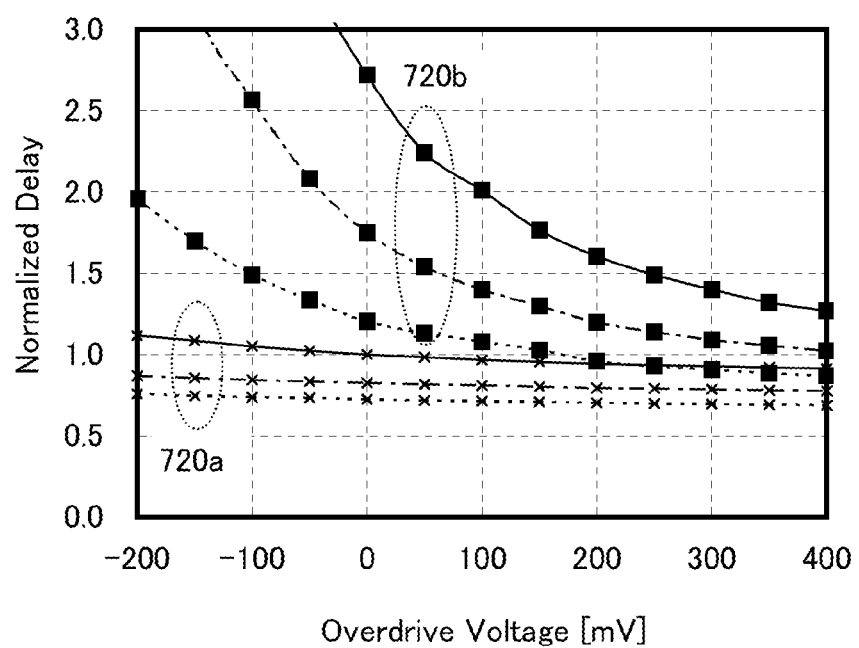
FIG. 17 shows a relation between overdrive voltage and delay time.

FIG. 17 shows the measurement results of the delay time. In FIG. 17, the horizontal axis represents overdrive voltage (mV) and the vertical axis represents delay time per stage of the RO. Note that in FIG. 17, the delay time on the vertical axis is relative to a measured delay time with $VDD_{RO}$ of 2.00 V and an overdrive voltage of 0 V. In FIG. 17, solid lines represent a delay time with $VDD_{RO}$ of 2.00 V; dashed-dotted lines, a delay time with $VDD_{RO}$ of 2.25 V; and chain lines, a delay time with $VDD_{RO}$ of 2.50 V.

As shown in FIG. 17, it is confirmed that the delay time of the RO circuit including the group 720a is shorter than that of the RO circuit including the group 720b, and that the delay time depends on the structures of the groups 720a and 720b.

Further, FIG. 17 shows that in the group 720b, the overdrive effect of increasing the switching speed by an increase in overdrive voltage is more pronounced with lower $VDD_{RO}$. However, the switching speed of the group 720b is not higher than that of the group 720a even when an overdrive voltage of more than 20% of $VDD_{RO}$ is applied. Note that when configuration data is written into the group 720a, the potential of the node FD is lowered due to the threshold voltage of the transistor 701 and thus becomes lower than $VDD_{MEM}$. Nevertheless, it is worth noting that the group 720a to which the overdrive voltage is not applied achieves a higher switching speed than the group 720b to which the overdrive voltage is applied.

It is also confirmed that with the same overdrive voltage, power consumption of the RO circuit including the group 720a is smaller than that of the RO circuit including the group 720b.

By SPICE simulation for the RO circuit TEG, the increase in the potential of the node FD with an increase in the potential of the signal IN in the RO circuit including the group 720a was evaluated. In the simulation, $VDD_{RO}$ was 2.5 V. The simulation results show that with an increase in the potential of the signal IN, the potential of the node FD is increased by 0.75 V when the configuration data is "1" and by 0.07 V when the configuration data is "0".

As mentioned above, it was demonstrated that a semiconductor device including the group 720a achieves high performance such as low power consumption and high switching speed even when the semiconductor device uses a single power supply voltage without using an overdrive voltage.

This embodiment can be combined with any of the other embodiments as appropriate.

EXPLANATION OF REFERENCE

30: LUT, 31: multiplexer, 32: multiplexer, 33: multiplexer, 34: multiplexer, 35: multiplexer, 36: multiplexer, 37: multiplexer, 40: LUT, 41: multiplexer, 42: multiplexer, 43: multiplexer, 44: OR circuit, 51: transistor, 52: inverter, 53: inverter, 54: inverter, 60: switch, 61a: first transistor, 61b: first transistor, 61c: first transistor, 62a: second transistor, 62b: second transistor, 62c: second transistor, 63_1: wiring, 63_2: wiring, 64_1a: wiring, 64_1b: wiring, 64_1c: wiring, 64_2a: wiring, 64_2b: wiring, 64_2c: wiring, 65a: wiring, 65b: wiring, 65c: wiring, 65_1a: wiring, 65_1b: wiring, 65_1c: wiring, 652a: wiring, 65_2b: wiring, 652c: wiring, 66a: capacitor, 66b: capacitor, 66c: capacitor, 101: logic array, 102: programmable logic element, 103a: horizontal wiring group, 103b: vertical wiring group, 104: switch box, 105: output terminal, 106: switch group, 110: wiring, 111: wiring, 112: switch, 113: switch, 114: switch, 115: switch, 116: switch, 117: switch, 200: switch, 201a: first transistor, 201b: first transistor, 201c: first transistor, 202a: second transistor, 202b: second transistor, 202c: second transistor, 203a: node, 203b: node, 203c: node, 204a: capacitor, 204b: capacitor, 204c: capacitor, 205a: wiring, 205b: wiring, 205c: wiring, 206a: wiring, 206b: wiring, 206c: wiring, 207: wiring, 210: wiring, 211: wiring, 212: programmable logic element, 213: lookup table, 214: flip-flop, 215: AND circuit, 216: wiring, 217: wiring, 218: programmable logic element, 219: lookup table, 220: flip-flop, 221: AND circuit, 230: group, 231: group, 232: group, 300: switch, 301a: first transistor, 301b: first transistor, 301c: first transistor, 302a: second transistor, 302b: second transistor, 302c: second transistor, 303a: node, 303b: node, 303c: node, 304a: capacitor, 304b: capacitor, 304c: capacitor, 305a: wiring, 305b: wiring, 305c: wiring, 306a: wiring, 306b: wiring, 306c: wiring, 307: wiring, 310: wiring, 311: wiring, 312: programmable logic element, 313: lookup table, 314: flip-flop, 315: AND circuit, 316: wiring, 317: wiring, 318: programmable logic element, 319: lookup table, 320: flip-flop, 321: AND circuit, 330: group, 331: group, 332: group, 400: switch, 401a: first transistor, 401b: first transistor, 401n: first transistor, 402a: second transistor, 402b: second transistor, 402n: second transistor, 403a: node, 403b: node, 403n: node, 404a: capacitor, 404b: capacitor, 404n: capacitor, 405a: wiring, 405b: wiring, 405n: wiring, 406a: wiring, 406b: wiring, 406n: wiring, 407: wiring, 410: wiring, 411: wiring, 412: programmable logic element, 413: lookup table, 414: flip-flop, 415: AND circuit, 418: programmable logic element, 419: lookup table, 420: flip-flop, 421: AND circuit, 430: group, 431: group, 432: group, 500: switch, 501a: first transistor, 501b: first transistor, 502a: second transistor, 502b: second transistor, 503a: node, 503b: node, 504a: capacitor, 504b: capacitor, 505a: wiring, 505b: wiring, 506a: wiring, 506b: wiring, 507: wiring, 510: wiring, 511: wiring, 512: programmable logic element, 513: lookup table, 514: flip-flop, 515: AND circuit, 518: programmable logic element, 519: lookup table, 520: flip-flop, 521: AND circuit, 530: group, 531: group, 540: transistor, 600: switch, 601a: first transistor, 601b: first transistor, 601c: first transistor, 602a: second transistor, 602b: second transistor, 602c: second transistor, 603a: node, 603b: node, 603c: node, 605a: wiring, 605b: wiring, 605c: wiring, 606a: wiring, 606b: wiring, 606c: wiring, 607: wiring, 608a: third transistor, 608b: third transistor, 608c: third transistor, 610: wiring, 611: wiring, 612: programmable logic element, 613: lookup table, 614: flip-flop, 615: AND circuit, 616: wiring, 617: wiring, 618: programmable logic element, 619: lookup table, 620: flip-flop, 621: AND circuit, 630: group, 631: group, 632: group, 701: transistor, 702: transistor, 720a: group, 720b: group, 721: wiring, 722: wiring, 780: inverter, 781: inverter, 900: substrate, 901: second transistor, 902: first transistor, 903: capacitor, 904: well, 905: STI, 906: impurity region, 907: gate insulating film, 908: gate electrode layer, 909: sidewall insulating film, 910: insulating film, 911: insulating film, 912: insulating film, 913: contact plug, 914: wiring layer, 915: contact plug, 916: wiring layer, 917: contact plug, 918: wiring layer, 919: insulating film, 920: insulating film, 921: contact plug, 922: wiring layer, 923: backgate electrode layer, 924: insulating film, 925: contact plug, 926: oxide semiconductor film, 927: source electrode layer, 928: drain electrode layer, 929: gate insulating film, 930: gate electrode layer, 931: upper electrode layer, 932: insulating film, 933: insulating film, 934: insulating film, 935: contact plug, 936: wiring layer, 937: protective insulating film, 5001: housing, 5002: housing, 5003: display portion, 5004: display portion, 5005: microphone, 5006: speaker, 5007: operation key, 5008: stylus, 5101: car body, 5102: wheel, 5103: dashboard, 5104: light, 5301: housing, 5302: refrigerator door, 5303: freezer door, 5401: housing, 5402: display portion, 5403: keyboard, 5404: pointing device, 5601: housing, 5602: housing, 5603: display portion, 5604: display portion, 5605: joint, 5606: operation key, 5801: housing, 5802: housing, 5803: display portion, 5804: operation key, 5805: lens, 5806: joint, IN1: input terminal, IN2: input terminal, IN3: input terminal, IN4: input terminal, A1: control terminal, A2: input terminal, A3: input terminal, A4: input terminal, A5: input terminal, A6: control terminal, A7: input terminal, A8: input terminal, M1: input terminal, M2: input terminal, M3: input terminal, M4: input terminal, M5: input terminal, M6: input terminal, M7: input terminal, M8: input terminal, OUT: output terminal This application is based on Japanese Patent Application serial No. 2012-105031 filed with Japan Patent Office on May 2, 2012, the entire contents of which are hereby incorporated by reference.

The invention claimed is:

1. A semiconductor device comprising:
   a first programmable logic element and a second programmable logic element;
   a vertical wiring interposed between the first programmable logic element and the second programmable logic element;
   a horizontal wiring perpendicular to the vertical wiring; and
   a group of switches located at a cross point of the vertical wiring and the horizontal wiring, the group of switches comprising first to sixth switches,
   wherein:
   the first switch and the second switch are configured to determine conduction between the vertical wiring and the horizontal wiring;
   the third switch and the fourth switch are configured to determine conduction between the vertical wiring and the horizontal wiring;

the fifth switch and the sixth switch are configured to determine conduction of the vertical wiring and the horizontal wiring, respectively, and
wherein each of the first to sixth switches comprises a first transistor including an oxide semiconductor in a channel formation region.

2. The semiconductor device according to claim 1,
wherein each of the first to sixth switches comprises:
a second wiring; and
a plurality of circuit groups,
wherein each of the plurality of circuit groups comprises:
a first wiring; and
the first transistor and a second transistor each comprising a gate, a source, and a drain, and
wherein:
the gate of the first transistor is electrically connected to the first wiring;
the source of the first transistor is electrically connected to the second wiring;
the gate of the second transistor is electrically connected to the drain of the first transistor;
the sources of the second transistors of the plurality of circuit groups are electrically connected to one another;
the drains of the second transistors of the plurality of circuit groups are electrically connected to one another;
the first programmable logic element is electrically connected to the sources of the second transistors of the plurality of circuit groups; and
the second programmable logic element is electrically connected to the drains of the second transistors of the plurality of circuit groups.

3. The semiconductor device according to claim 2,
wherein each of the plurality of circuit groups further comprises a capacitor and a third wiring, and
wherein, in each of the plurality of circuit groups, one of electrodes of the capacitor is electrically connected to the gate of the second transistor and the other of the electrodes of the capacitor is electrically connected to the third wiring.

4. The semiconductor device according to claim 2, wherein the second transistor comprises silicon in a channel formation region.

5. The semiconductor device according to claim 2, wherein the second transistor is a p-channel transistor.

6. The semiconductor device according to claim 2, wherein the number of the plurality of circuit groups is 2.

7. A semiconductor device comprising:
a first programmable logic element and a second programmable logic element;
a vertical wiring interposed between the first programmable logic element and the second programmable logic element;
a horizontal wiring perpendicular to the vertical wiring; and
a group of switches located at a cross point of the vertical wiring and the horizontal wiring, the group of switches comprising first to sixth switches,
wherein:
the first switch and the second switch are configured to determine conduction between the vertical wiring and the horizontal wiring;
the third switch and the fourth switch are configured to determine conduction between the vertical wiring and the horizontal wiring; and
the fifth switch and the sixth switch are configured to determine conduction of the vertical wiring and the horizontal wiring, respectively,
wherein each of the first to sixth switches comprises a first transistor including an oxide semiconductor in a channel formation region,
wherein each of the first to sixth switches comprises:
a first wiring and a second wiring; and
the first transistor and a second transistor each comprising a gate, a source, and a drain,
wherein:
the gate of the first transistor is electrically connected to the first wiring;
the source of the first transistor is electrically connected to the second wiring; and
the gate of the second transistor is electrically connected to the drain of the first transistor,
wherein the first programmable logic element is electrically connected to the source of the second transistor, and
wherein the second programmable logic element is electrically connected to the drain of the second transistor.

8. The semiconductor device according to claim 7,
wherein each of the first to sixth switches further comprises a capacitor and a third wiring, and
wherein one of electrodes of the capacitor is electrically connected to the gate of the second transistor and the other of the electrodes of the capacitor is electrically connected to the third wiring.

9. The semiconductor device according to claim 7, wherein the second transistor comprises silicon in a channel formation region.

10. The semiconductor device according to claim 7, wherein the second transistor is a p-channel transistor.

11. A semiconductor device comprising:
a first programmable logic element and a second programmable logic element;
a vertical wiring interposed between the first programmable logic element and the second programmable logic element;
a horizontal wiring perpendicular to the vertical wiring; and
a group of switches located at a cross point of the vertical wiring and the horizontal wiring, the group of switches comprising first to sixth switches,
wherein:
the first switch and the second switch are configured to determine conduction between the vertical wiring and the horizontal wiring;
the third switch and the fourth switch are configured to determine conduction between the vertical wiring and the horizontal wiring; and
the fifth switch and the sixth switch are configured to determine conduction of the vertical wiring and the horizontal wiring, respectively,
wherein each of the first to sixth switches comprises a first transistor including an oxide semiconductor in a channel formation region,
wherein each of the first to sixth switches comprises:
a first wiring and a second wiring; and
the first transistor, a second transistor, and a third transistor each comprising a gate, a source, and a drain,
wherein:
the gate of the first transistor is electrically connected to the first wiring;
the source of the first transistor is electrically connected to the second wiring;
the gate of the second transistor is electrically connected to the drain of the first transistor; and the source of the third transistor is electrically connected to the drain of the second transistor, wherein the first programmable logic element is electrically connected to the source of the second transistor, and wherein the second programmable logic element is electrically connected to the drain of the third transistor.

12. The semiconductor device according to claim 11, wherein each of the first to sixth switches further comprises a third wiring, and wherein the gate of the third transistor is electrically connected to the third wiring.

13. The semiconductor device according to claim 11, wherein each of the second transistor and the third transistor comprises silicon in a channel formation region.

14. The semiconductor device according to claim 11, wherein each of the second transistor and the third transistor is a p-channel transistor.

* * * * *